(12) United States Patent
You et al.

(10) Patent No.: US 8,697,524 B2
(45) Date of Patent: Apr. 15, 2014

(54) METHODS OF MANUFACTURING VERTICAL SEMICONDUCTOR DEVICES

(75) Inventors: Byung-Kwan You, Seoul (KR); Kwang-Soo Seol, Yongin-si (KR); Young-Woo Park, Seoul (KR); Jin-Soo Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 404 days.

(21) Appl. No.: 13/212,485

(22) Filed: Aug. 18, 2011

(65) Prior Publication Data

US 2012/0058629 A1    Mar. 8, 2012

(30) Foreign Application Priority Data

Sep. 7, 2010    (KR) .................... 10-2010-0087327

(51) Int. Cl.
*H01L 21/336* (2006.01)
(52) U.S. Cl.
USPC .............. 438/288; 438/479; 257/E21.21
(58) Field of Classification Search
CPC ............................................. H01L 27/11578
USPC ............. 438/479, 589, 192, 288, 209, 212; 257/E21.21, E21.09
See application file for complete search history.

(56) References Cited

U.S. PATENT DOCUMENTS

| | | | |
|---|---|---|---|
| 7,884,417 B2* | 2/2011 | Mizukami et al. | 257/324 |
| 7,902,591 B2* | 3/2011 | Kito et al. | 257/324 |
| 8,013,389 B2* | 9/2011 | Oh et al. | 257/331 |
| 8,563,378 B2* | 10/2013 | Shim et al. | 438/268 |
| 2009/0242966 A1* | 10/2009 | Son et al. | 257/324 |
| 2010/0044778 A1* | 2/2010 | Seol et al. | 257/326 |
| 2011/0111579 A1* | 5/2011 | Kito et al. | 438/479 |
| 2011/0233648 A1* | 9/2011 | Seol et al. | 257/324 |
| 2012/0049268 A1* | 3/2012 | Chang et al. | 257/324 |

FOREIGN PATENT DOCUMENTS

| | | |
|---|---|---|
| KR | 100481869 | 4/2005 |
| KR | 1020090047614 | 5/2009 |
| KR | 1020090078102 | 7/2009 |
| KR | 1020100024096 | 3/2010 |

* cited by examiner

*Primary Examiner* — Jarrett Stark
(74) *Attorney, Agent, or Firm* — Harness, Dickey & Pierce, P.L.C.

(57) ABSTRACT

Methods of manufacturing vertical semiconductor devices may include forming a mold structure including sacrificial layers and insulating interlayers with a first opening formed therethrough. The sacrificial layers and the insulating interlayers may be stacked repeatedly and alternately on a substrate. The first opening may expose the substrate. Blocking layers may be formed by oxidizing portions of the sacrificial layers exposed by the first opening. A first semiconductor layer pattern, a charge trapping layer pattern and a tunnel insulation layer pattern, respectively, may be formed on the sidewall of the first opening. A second semiconductor layer may be formed on the first polysilicon layer pattern and the bottom of the first opening. The sacrificial layers and the insulating interlayers may be partially removed to form a second opening. The sacrificial layers may be removed to form grooves between the insulating interlayers. Control gate electrodes may be formed in the grooves.

20 Claims, 22 Drawing Sheets

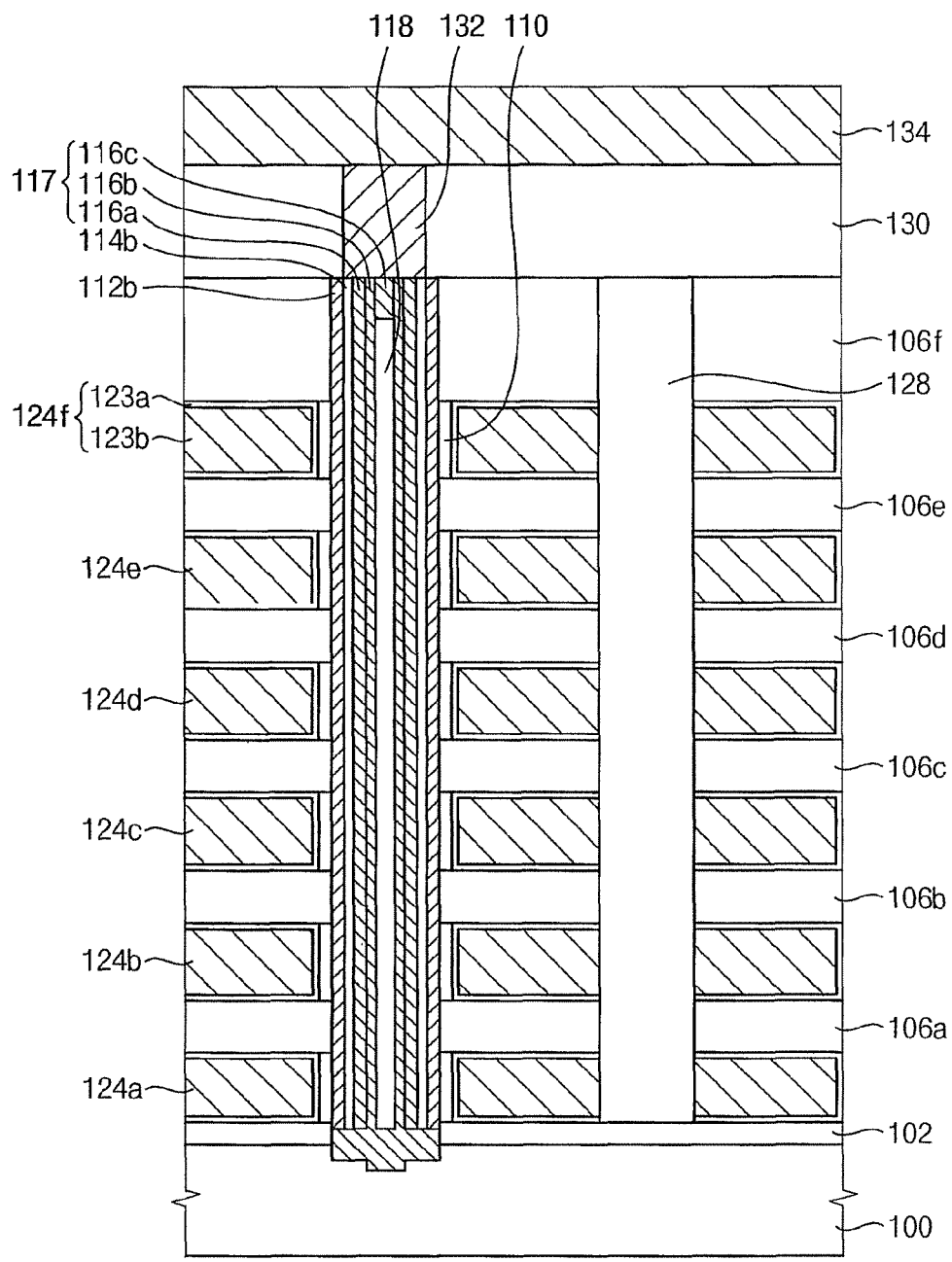
FIG. 2K
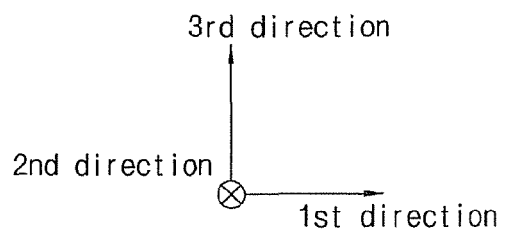

FIG. 4D
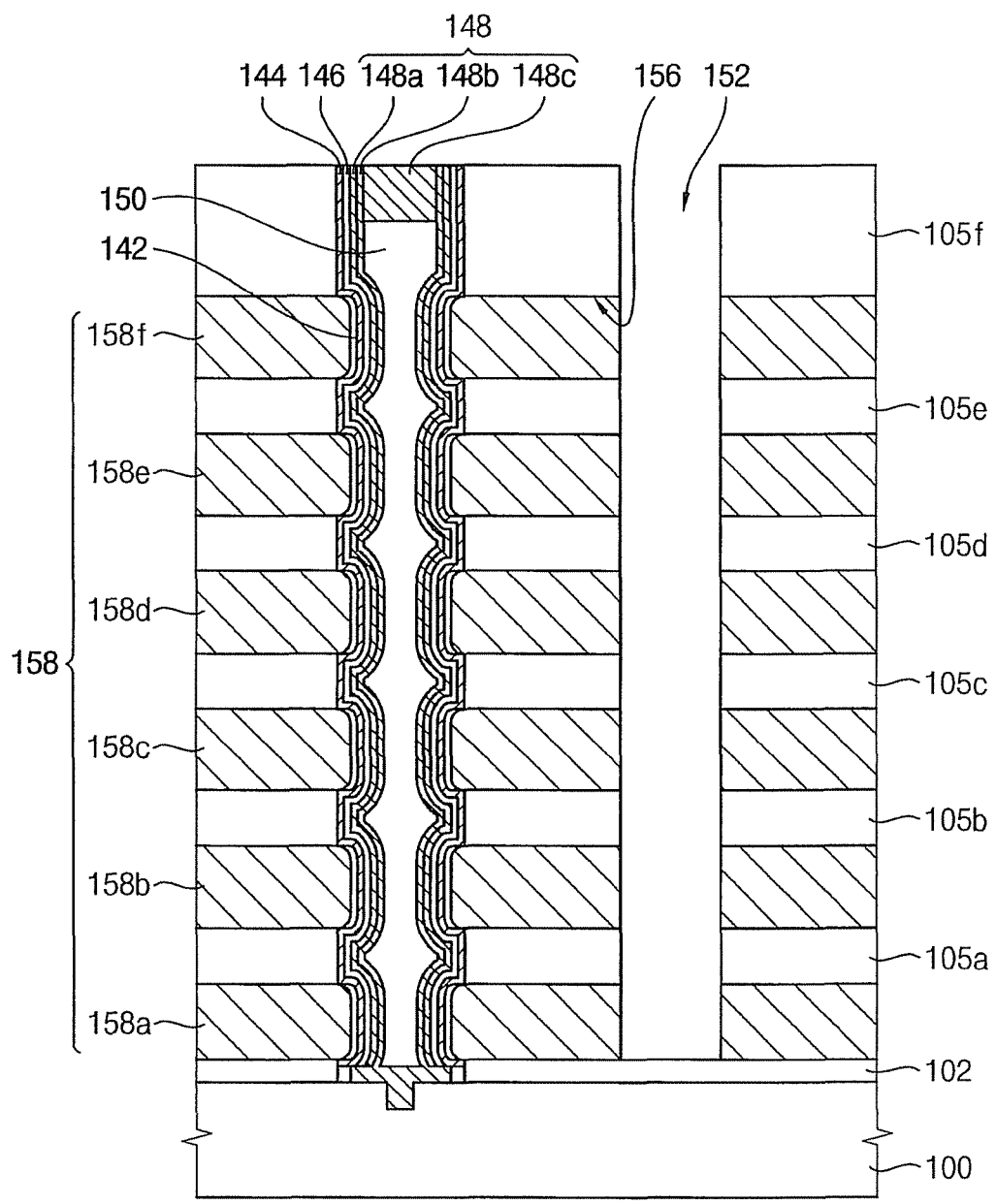
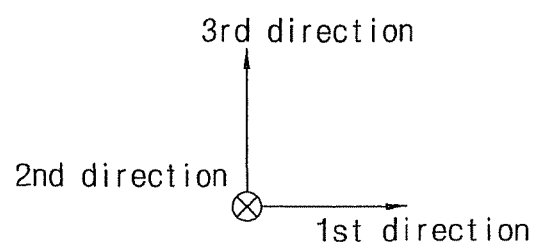

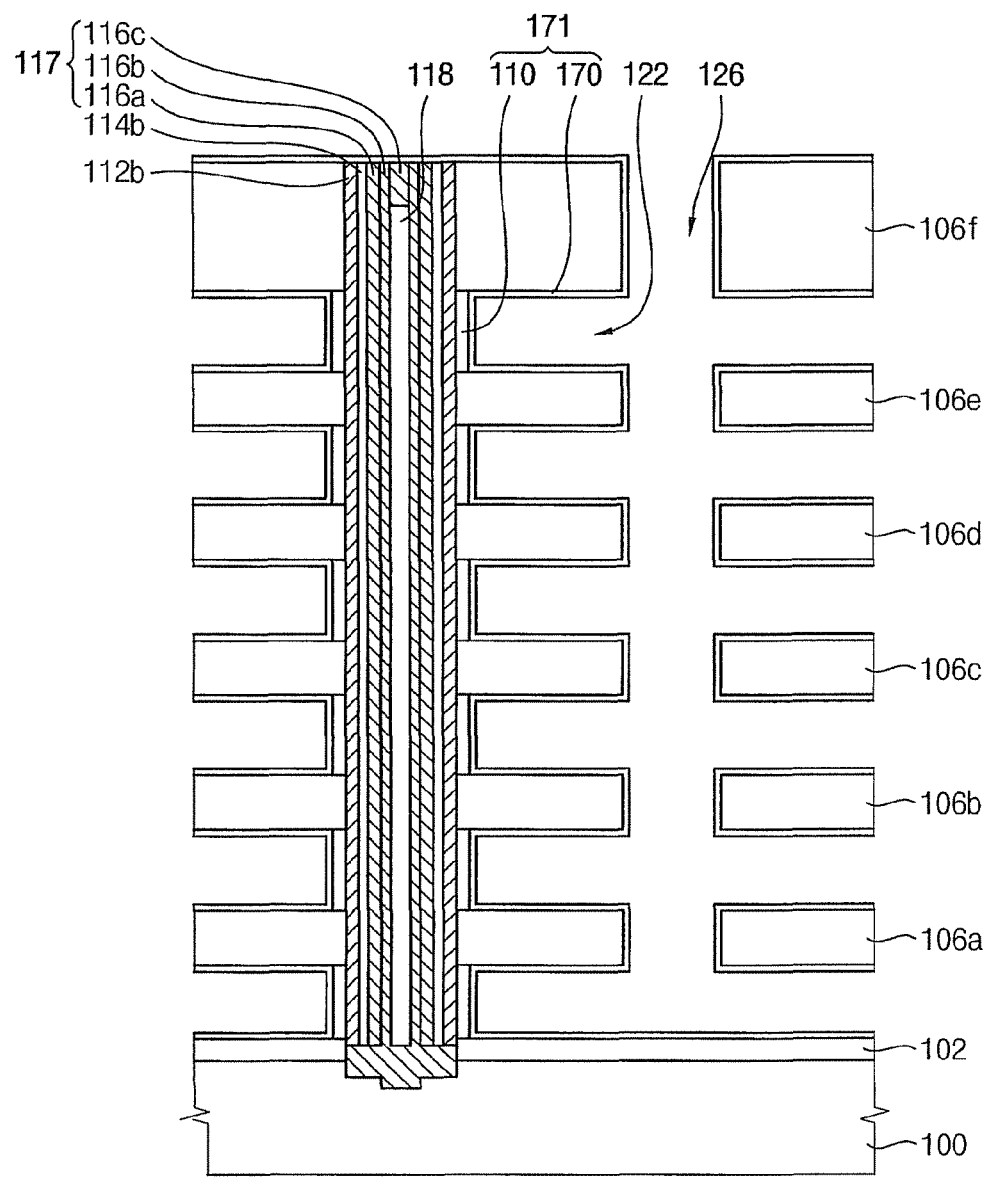

METHODS OF MANUFACTURING VERTICAL SEMICONDUCTOR DEVICES

CROSS-REFERENCE TO RELATED APPLICATION

This application claims priority under 35 USC §119 to Korean Patent Application No. 10-2010-0087327 filed on Sep. 7, 2010, in the Korean Intellectual Property Office (KIPO), the entire contents of which is incorporated herein by reference.

BACKGROUND

1. Field

Example embodiments relate to methods of manufacturing vertical semiconductor devices. More particularly, example embodiments relate to methods of manufacturing non-volatile memory devices including vertical channels.

2. Description of the Related Art

In order to improve the integration density of memory devices a plurality of transistors may be arranged in a vertical direction relative to a substrate. In order to manufacture memory devices with vertically arranged transistors, high aspect ratio holes are formed through multi-stacked layers and thin layers are formed in the holes. However, the thin layers may not be easily formed in the holes with a uniform thickness if the holes are narrow. The reliability of vertical semiconductor devices including vertically stacked transistors with non-uniform thin layers may be low.

SUMMARY

Example embodiments may provide methods of manufacturing high and/or improved reliability vertical semiconductor devices with high and/or increased integration density.

According to example embodiments, there is provided a method of manufacturing a vertical semiconductor device. In the method, a mold structure including sacrificial layers and insulating interlayers and having a first opening therethrough is formed. The sacrificial layers and the insulating interlayers are stacked repeatedly and alternately on a substrate. The first opening exposes the substrate. Blocking layers are formed by oxidizing portions of the sacrificial layers exposed by the first opening. A charge trapping layer, a tunnel insulation layer and a first polysilicon layer are formed on a bottom and a sidewall of the first opening. Portions of the first polysilicon layer, the charge trapping layer and the tunnel insulation layer on the bottom of the first opening are partially etched to form a first polysilicon layer pattern, a charge trapping layer pattern and a tunnel insulation layer pattern, respectively, on the sidewall of the first opening. A second polysilicon layer is formed on the first polysilicon layer pattern and the bottom of the first opening to form a semiconductor pattern including the first polysilicon layer pattern and the second polysilicon layer. The sacrificial layers and the insulating interlayers are partially removed to form a second opening. The sacrificial layers are removed to form grooves between the insulating interlayers. Control gate electrodes are formed in the grooves.

According to example embodiments, the sacrificial layers may be formed using silicon nitride. According to example embodiments, the blocking layers may include silicon oxide. According to example embodiments, the blocking layers may be formed by a radical oxidation process. According to example embodiments, a difference between a width of the first opening after forming the blocking layers and an initial width of the first opening is smaller than a thickness of each blocking layer. According to example embodiments, for forming the first polysilicon layer pattern, the charge trapping layer pattern and the tunnel insulation layer pattern, a portion of the first polysilicon layer on the bottom of the first opening may be etched to form the first polysilicon layer pattern on the sidewall of the first opening. Portions of the charge trapping layer and the tunnel insulation layer on the bottom of the first opening may be etched to expose the substrate.

According to example embodiments, an upper blocking layer may be further formed between each blocking layer and each control gate electrode. The upper blocking layer may include a metal oxide. According to example embodiments, for forming the control gate electrodes, a conductive layer may be formed to sufficiently fill the grooves and partially fill the second opening. The conductive layer in the second opening may be partially removed so that the conductive layer remains only in the grooves. According to example embodiments, the conductive layer may be formed by sequentially depositing a barrier metal layer and a metal layer.

According to example embodiments, the barrier metal layer may include titanium or titanium nitride. The metal layer may include tungsten. According to example embodiments, the upper blocking layer may be formed using aluminum oxide. According to example embodiments, the upper blocking layer may be formed conformally on the blocking layers and inner walls of the grooves. According to example embodiments, the second polysilicon layer may be formed on the sidewall and the bottom of the first opening not to completely fill the first opening. According to example embodiments, a filling layer may be further formed on the second polysilicon layer to fill the first opening. According to example embodiments, the charge trapping layer and the tunnel insulation layer are partially etched by a wet etching process.

According to example embodiments, in manufacturing the vertical semiconductor device, the number of layers that may be stacked on an inner wall of a hole having a high aspect ratio may be decreased. Thus, an effective diameter or an effective width of the hole may be increased so that the characteristics of a semiconductor pattern in the hole may be enhanced. In addition, the integration degree of the vertical semiconductor device may be increased because the hole need not be enlarged so as to have a sufficient diameter for obtaining good and/or improved characteristics of the semiconductor pattern.

According to at least one example embodiment, a method of manufacturing a vertical semiconductor device includes forming a mold structure including a plurality of sacrificial layers and a plurality of insulating interlayers by alternately stacking one of the sacrificial layers and one of the insulating interlayers on a substrate a plurality of times, forming a first opening through the mold structure to expose the substrate, forming a plurality of first blocking layers by oxidizing portions of the sacrificial layers exposed by the first opening, sequentially forming a charge trapping layer, a tunnel insulation layer and a first semiconductor layer on the substrate and a sidewall of the mold structure in the first opening, partially etching portions of the first semiconductor layer, the charge trapping layer and the tunnel insulation layer on the substrate in the first opening to form a first semiconductor layer pattern, a charge trapping layer pattern and a tunnel insulation layer pattern on the sidewall of the mold structure, forming a second semiconductor layer on the first semiconductor layer pattern and the substrate to form a second semiconductor layer pattern including the first semiconductor layer pattern and the second semiconductor layer, partially removing the sacrificial layers and the insulating interlayers to form a second opening, removing the sacrificial layers to form grooves between the insulating interlayers, and forming a plurality of control gate electrodes in the grooves.

According to at least one example embodiment, a method of manufacturing a vertical semiconductor device includes forming a first insulating layer, forming a first sacrificial layer including a first material on the first insulating layer, forming a second insulating layer on the first sacrificial layer, forming a second sacrificial layer including a second material on the second insulating layer, removing part of the first insulating layer, the first sacrificial layer, the second insulating layer and the second sacrificial layer to form a sidewall, oxidizing portions of the first and second materials exposed along the sidewall, and removing unoxidized portions of the first and second materials.

BRIEF DESCRIPTION OF THE DRAWINGS

Example embodiments will be more clearly understood from the following detailed description taken in conjunction with the accompanying drawings. FIGS. 1-8 represent non-limiting, example embodiments as described herein.

FIG. 1 is a circuit diagram illustrating vertical semiconductor devices in accordance with example embodiments;

FIGS. 2A-2K are cross-sectional diagrams illustrating methods of manufacturing vertical semiconductor devices in accordance with example embodiments;

FIGS. 4A-4E are cross-sectional diagrams illustrating methods of manufacturing vertical semiconductor devices in accordance with other example embodiments;

FIGS. 5A-5C are cross-sectional diagrams illustrating methods of manufacturing vertical semiconductor devices in accordance with further example embodiments;

FIG. 6 is a block diagram illustrating memory cards including vertical semiconductor devices in accordance with example embodiments;

FIG. 7 is a block diagram illustrating systems including vertical semiconductor devices in accordance with example embodiments; and FIG. 8 is a block diagram illustrating portable devices including vertical semiconductor devices in accordance with example embodiments.

Figure 1:
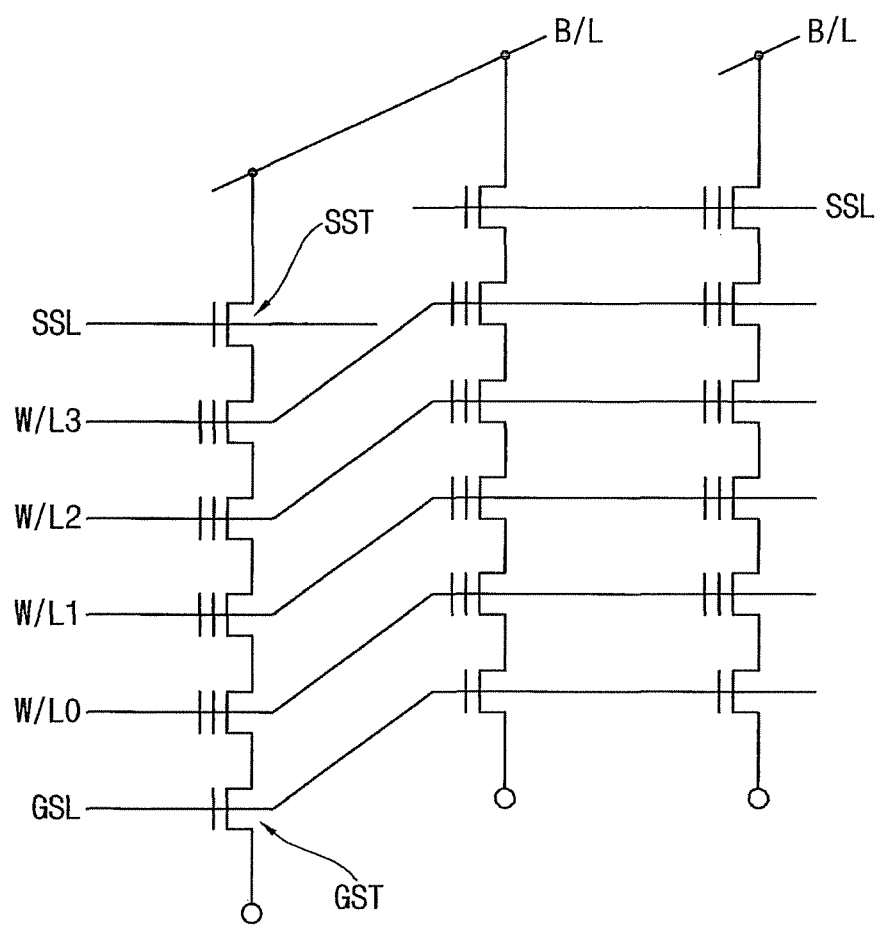

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram illustrating vertical semiconductor devices in accordance with example embodiments. Referring to FIG. 1, a vertical semiconductor device 10 may include a plurality of strings. Each of the plurality of strings may include a plurality of memory cells stacked in a vertical direction relative to a substrate (not shown). Each of the strings may include cell transistors and selection transistors connected in series to one another. Each of the cell transistors may include, for example, a tunnel insulation layer pattern, a charge trapping layer pattern, a dielectric layer pattern and a control gate electrode. The control gate electrodes of the cell transistors may serve as word lines W/L0-W/L3.

The cell transistors may be connected in series to one another in a vertical direction. A ground selection transistor (GST) and a string selection transistor (SST) may be at ends of each string, respectively. Each of the strings may be connected at one end to a bit line (B/L). A control gate electrode of the GST may serve as a ground selection line (GSL), and a control gate electrode of the SST may serve as a string selection line (SSL). Each string may include a plurality of GSTs and a plurality of SSTs connected in series. A common source line (CSL) may be connected to the GST. The word lines at the same level may be electrically connected to each other.

Figure 2A:
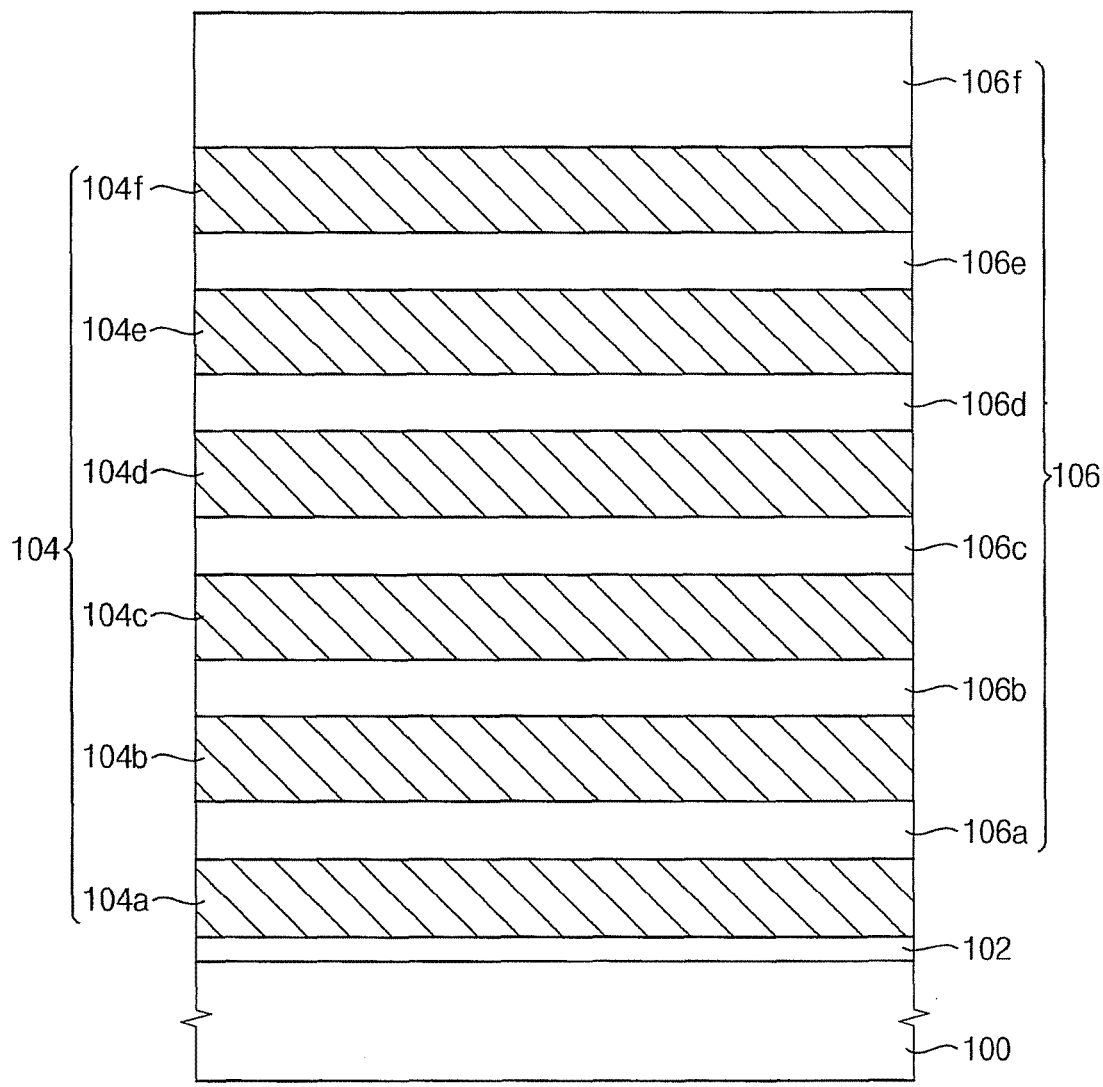

FIGS. 2A-2K are cross-sectional diagrams illustrating methods of manufacturing vertical semiconductor devices in accordance with example embodiments. Referring to FIG. 2A, a pad insulation layer 102 may be formed on a substrate 100. The pad insulation layer 102 may be formed by, for example, a thermal oxidation process on the substrate 100. The pad insulation layer 102 may reduce stress that may be generated when a first sacrificial layer 104a is formed directly on the substrate 100.

Sacrificial layers 104 and insulating interlayers 106 may be repeatedly and alternately formed on the pad insulation layer 102 in a direction vertical to a top surface of the substrate 100. The first sacrificial layer 104a may be formed on the pad insulation layer 102 and a first insulating interlayer 106a may be formed on the first sacrificial layer 104a. Other sacrificial layers 104b, 104c, 104d, 104e and 104f and insulating interlayers 106b, 106c, 106d, 106e and 106f may be sequentially and alternately formed on one another. The sacrificial layers 104 and the insulating interlayers 106 may be formed by, for example, a chemical vapor deposition (CVD) process and/or an atomic layer deposition (ALD) process.

The uppermost insulating interlayer 106f may be damaged and/or removed due to subsequent processing. The uppermost insulating interlayer 106f may be formed to be the thickest insulating interlayer among the insulating interlayers 106. The sacrificial layers 104 may be formed using a material with etch selectivity to the insulating interlayers 106. The sacrificial layers 104 may be formed using a material with etch selectivity to a material of a semiconductor pattern (e.g., polysilicon).

The sacrificial layers 104 may be formed using a material that may be rapidly removed by a wet etch process so that the insulating interlayers 106 are exposed to an etch solution for a short and/or reduced time. The insulating interlayers 106 may be prevented from being damaged and/or removed by the etch solution during the wet etch process for removing the sacrificial layers 104, or damage and removal may be reduced. According to at least one example embodiment, the insulating interlayers 106 may include silicon oxide and the sacrificial layers 104 may include silicon nitride.

A transistor may be formed in a space from which a sacrificial layer 104 is removed, and the number of the sacrificial layers 104 may be greater than or equal to the number of the transistors of a string including cell transistors and selection transistors. In such example embodiments, the string may be described as including 4 cell transistors and 2 selection transistors for purposes of example only. The number of the cell transistors and the selection transistors are not limited.

Figure 2B:
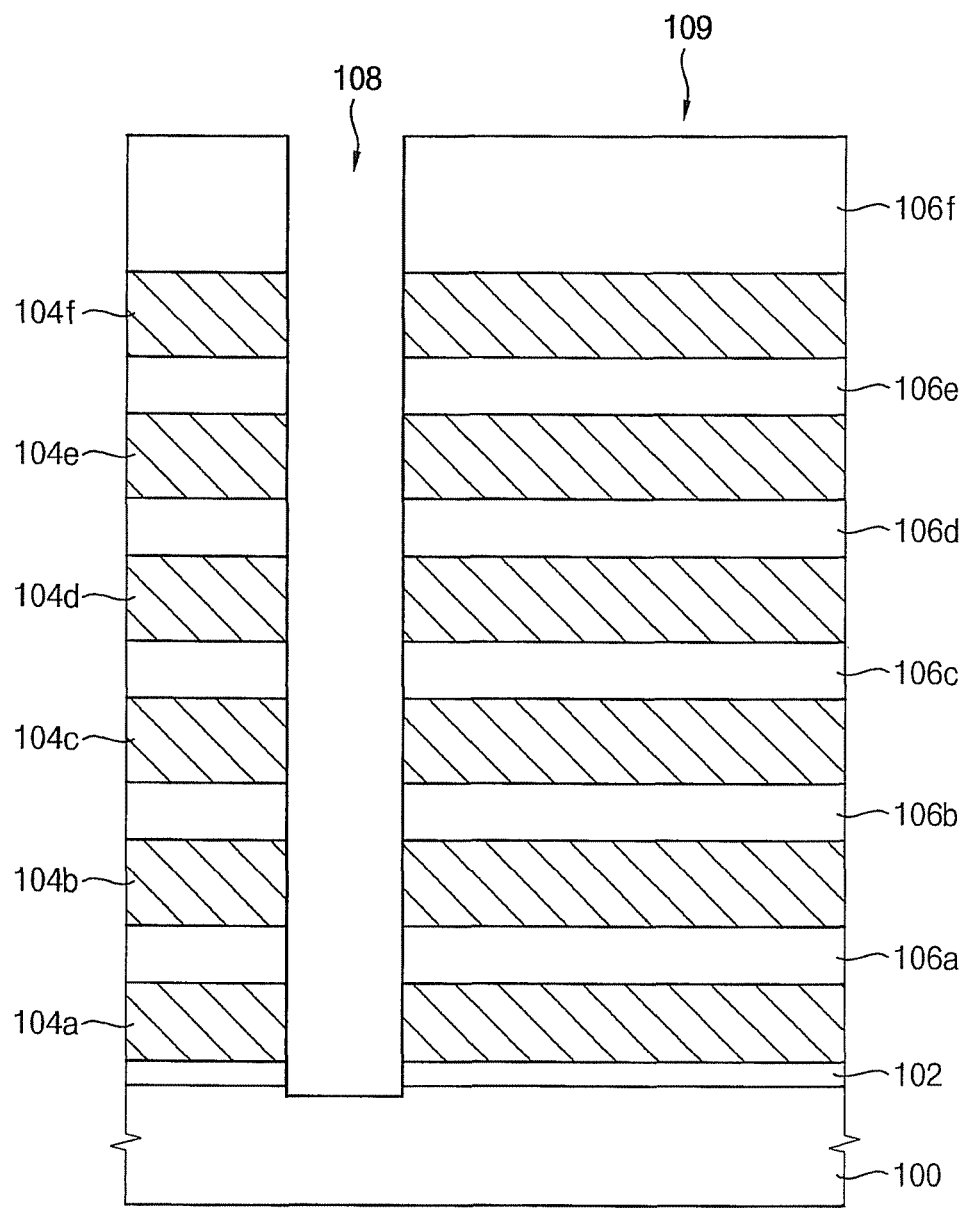

Referring to FIG. 2B, a mask pattern (not shown) may be formed on the uppermost insulating interlayer 106f. The insulating interlayers 106, the sacrificial layers 104 and the pad insulation layer 102 may be partially removed using the mask pattern as an etch mask to faun a first opening 108 to expose a top surface of the substrate 100. According to example embodiments, a plurality of first openings 108 may be formed, and the first openings 108 may be formed, for example, with island shape from each other. A mold structure 109 with the first openings 108 may be formed.

A semiconductor pattern may be formed in the first openings 108 to serve as a channel region. The first openings 108 may be formed regularly in both of first and second directions that are substantially perpendicular to each other. Sidewalls of the insulating interlayers 106 and the sacrificial layers 104 may be exposed by the first opening 108.

Figure 2C:
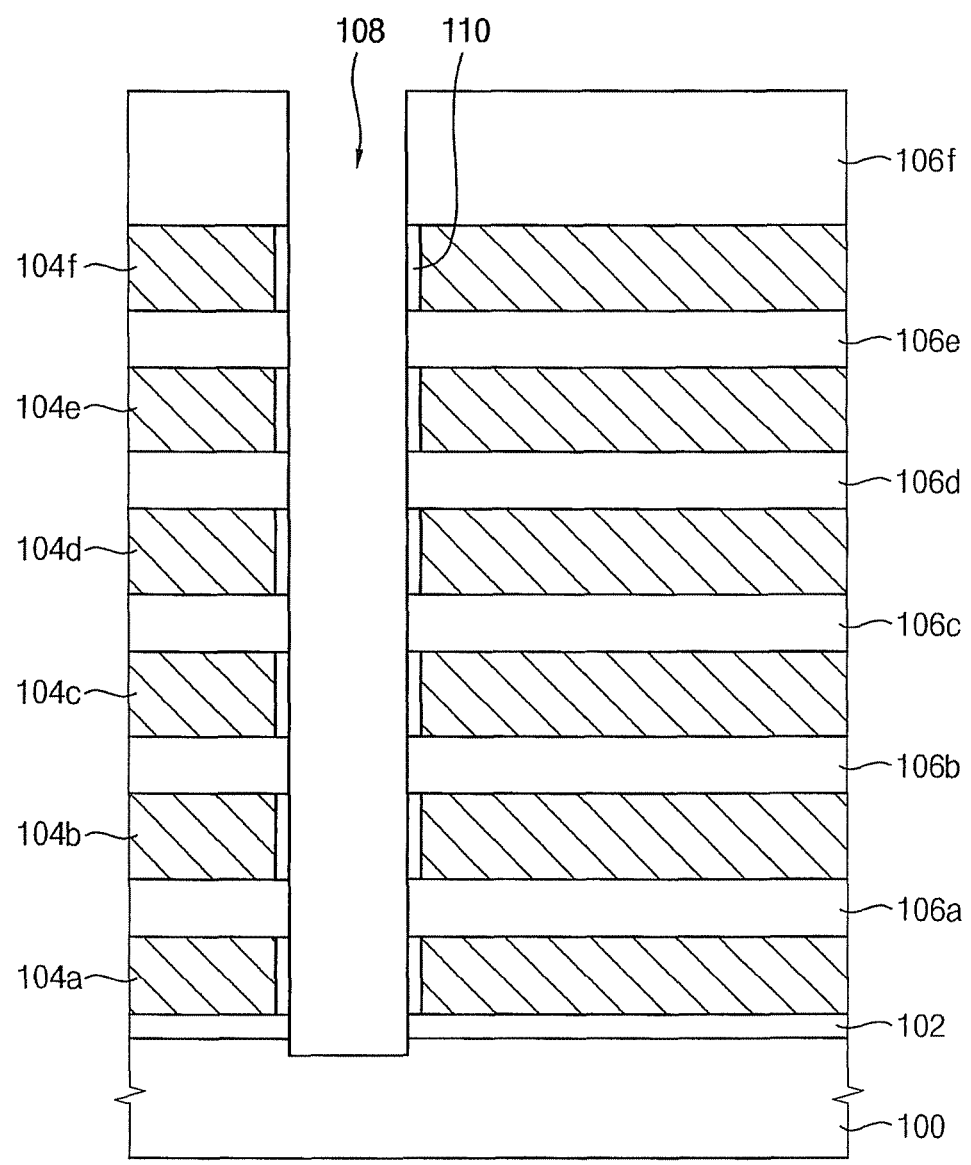

Referring to FIG. 2C, the sidewalls of the sacrificial layers 104 exposed by the first opening 108 may be oxidized to form blocking layers 110. The sidewalls of the sacrificial layers 104 may include silicon nitride and may be treated in an oxidizing atmosphere to form the blocking layers 110. For example, the blocking layers 110 may be formed by a radical oxidizing process. If the blocking layer 110 is formed by a deposition process on an inner wall of the first opening 108, the diameter or the width of the first opening 108 may be decreased by two times the thickness of the blocking layer 110.

According to the example embodiments, the blocking layer 110 may be formed by oxidizing a portion of the sacrificial layer 104. A diameter or a width of the first opening 108 may not be reduced or may remain nearly constant after forming the blocking layer 110. For example, difference between a width of the first opening 108 after forming the blocking layer 110 and an initial width of the first opening 108 may be smaller than a thickness of the blocking layer 110.

Figure 2D:
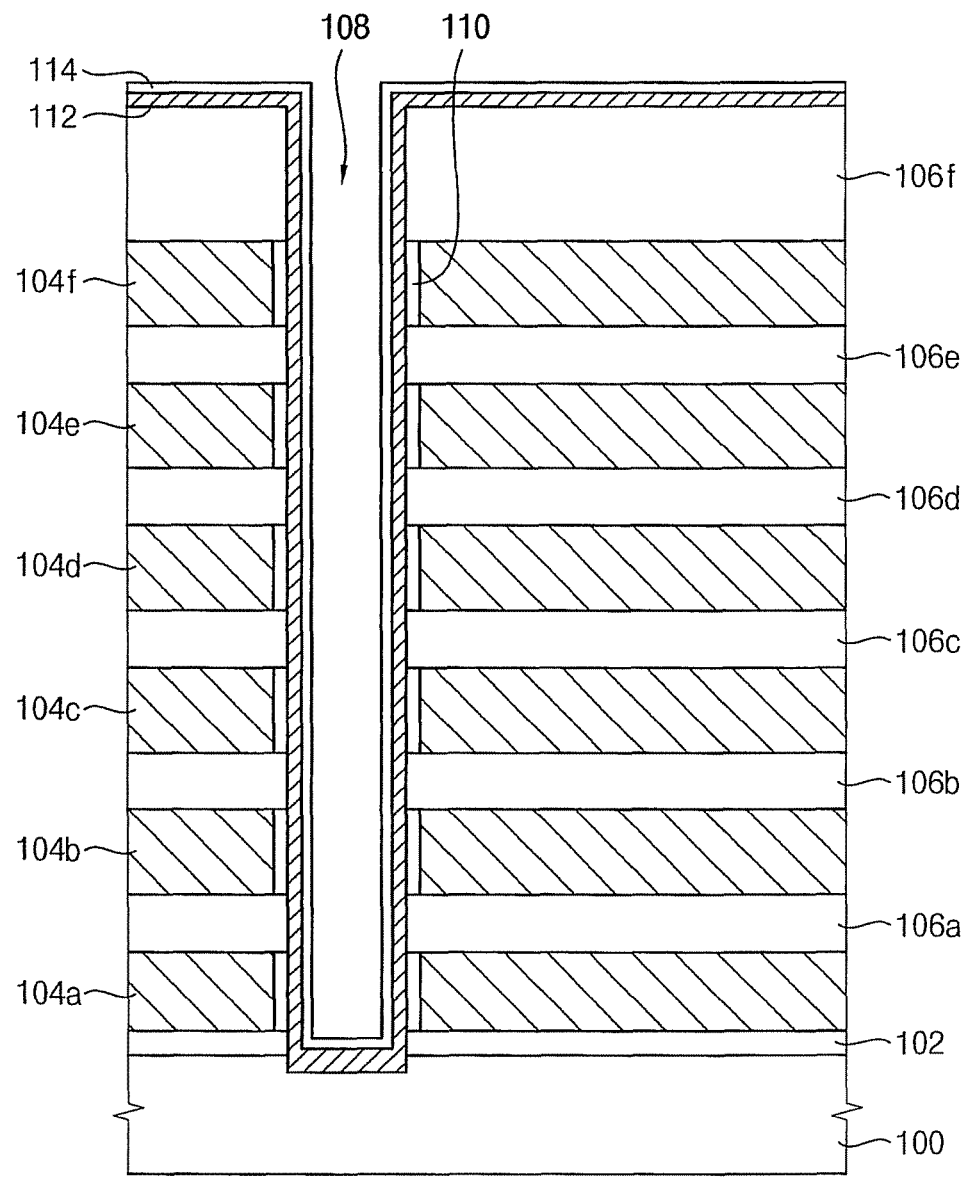
Figure 2E:
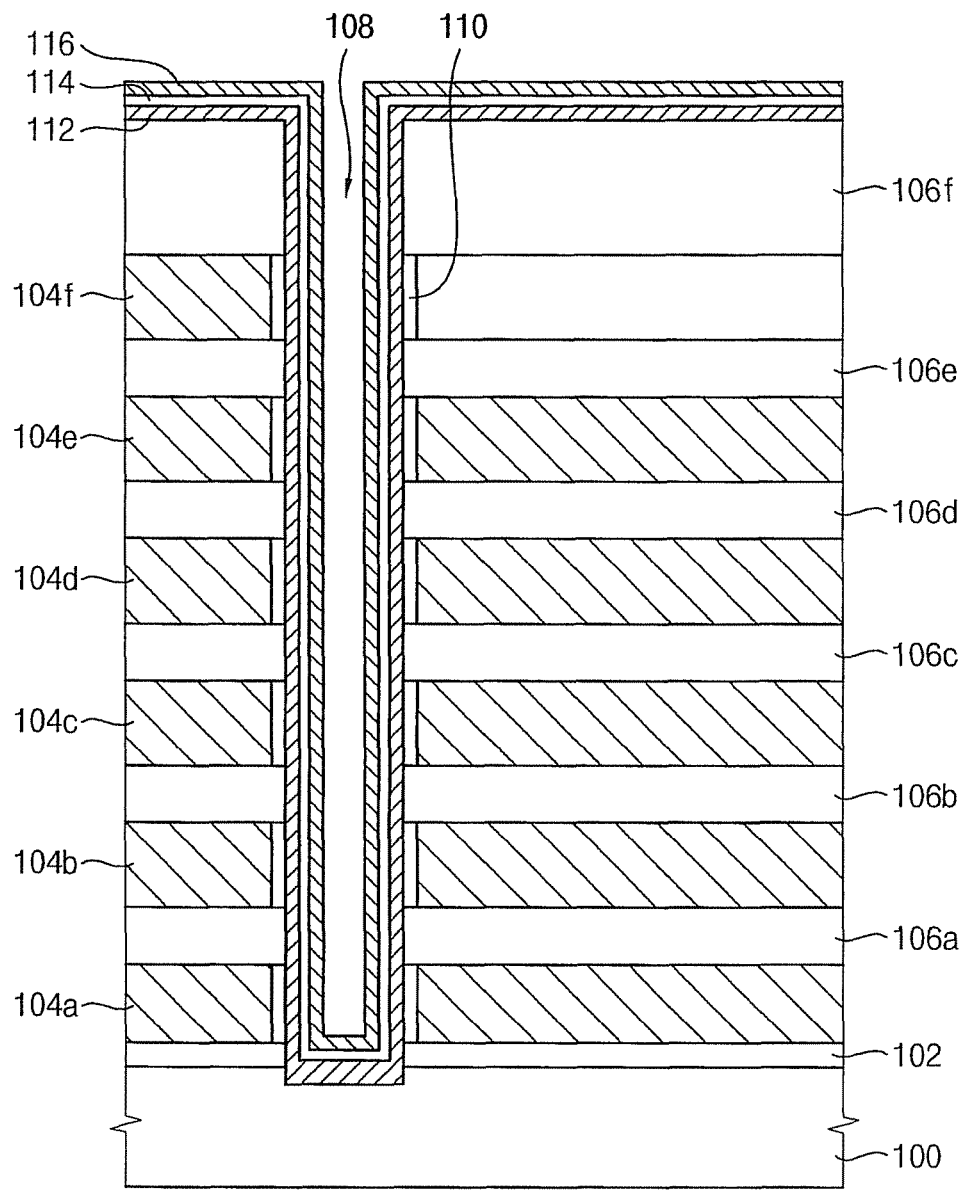

Referring to FIG. 2D, a charge trapping layer 112 may be formed on the uppermost insulating interlayer 106f, and on a bottom and sidewall inside the first opening 108. The charge trapping layer 112 may be formed to include, for example, silicon nitride deposited by chemical vapor deposition (CVD). A tunnel insulation layer 114 may be formed on the charge trapping layer 112. The charge trapping layer may include, for example, silicon oxide deposited by CVD. Referring to FIG. 2E, a first semiconductor layer 116 (e.g., polysilicon) may be formed on the tunnel insulation layer 114. The first semiconductor layer 116 may be formed to partially fill the first opening 108. The first semiconductor layer 116 may be formed conformally to the bottom and sidewall inside the first opening 108 and a top surface of the mold structure 109.

Figure 3A:
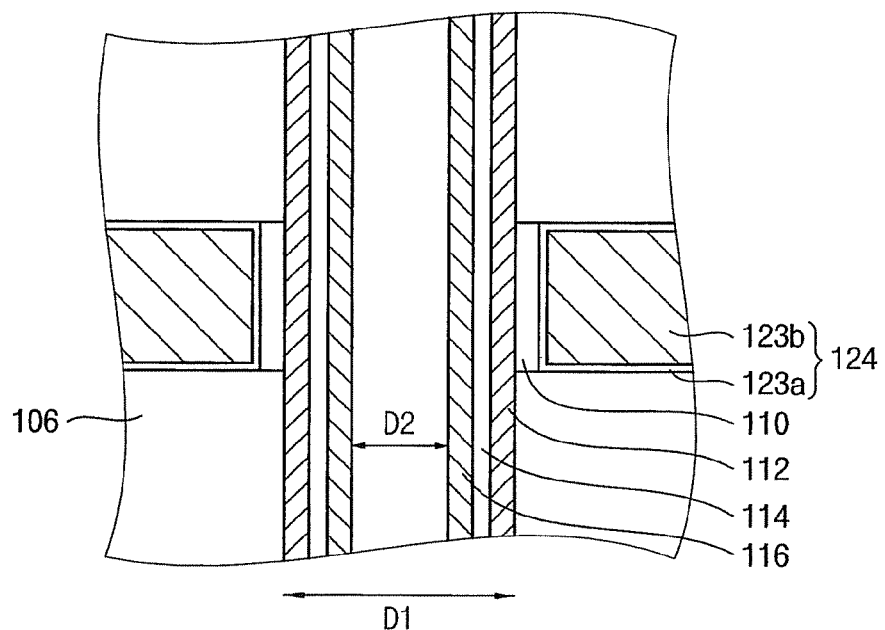
FIG. 3A is a partial, enlarged cross-sectional diagram illustrating a blocking layer, a charge trapping layer, a tunnel insulation layer and a first semiconductor layer formed in accordance with the example embodiments.

FIG. 3A is a partial, enlarged cross-sectional diagram illustrating a blocking layer 110, a charge trapping layer 112, a tunnel insulation layer 114 and a first semiconductor layer 116 formed in accordance with example embodiments. Referring to FIG. 3A, an initial width of the first opening 108 may be represented by "D1" The width of the first opening 108 may not be reduced by forming the blocking layer 110. The first opening 108 may be of sufficient width (represented by "D2") for forming a semiconductor pattern therein even after forming the charge trapping layer 112, the tunnel insulation layer 114 and the first semiconductor layer 116 (e.g., sequentially forming) on the blocking layer 110. Subsequent processes (e.g., deposition and/or etch processes) in the first opening 108 may be performed more easily.

Figure 3B:
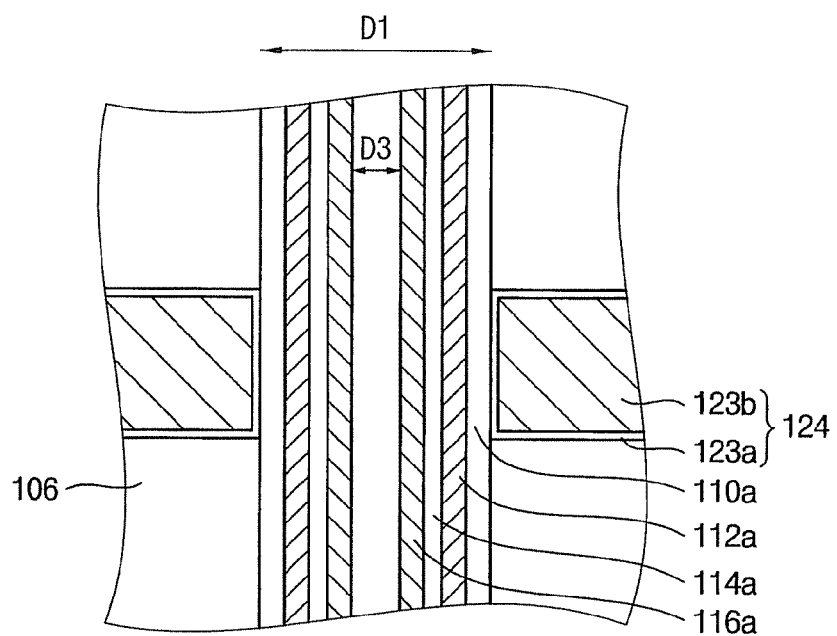
FIG. 3B is a partial, enlarged cross-sectional diagram illustrating a blocking layer, a charge trapping layer, a tunnel insulation layer and a first semiconductor layer formed by a general method.

FIG. 3B is a partial, enlarged cross-sectional diagram illustrating a blocking layer 110a, a charge trapping layer 112a, a tunnel insulation layer 114a and a first semiconductor layer 116a formed by a general method. Referring to FIG. 3B, an initial thickness of the first opening 108 may be represented by "D1" as in FIG. 3A. If the blocking layer 110a is formed by a deposition process, the width of the first opening 108 may be reduced by two times the thickness of the blocking layer 110a. A width of the first opening 108 after forming the charge trapping layer 112a, the tunnel insulation layer 114a and the first semiconductor layer 116a may be represented by "D3." The width D3 in FIG. 3B may be less than the width D2 in FIG. 3A.

Figure 2F:
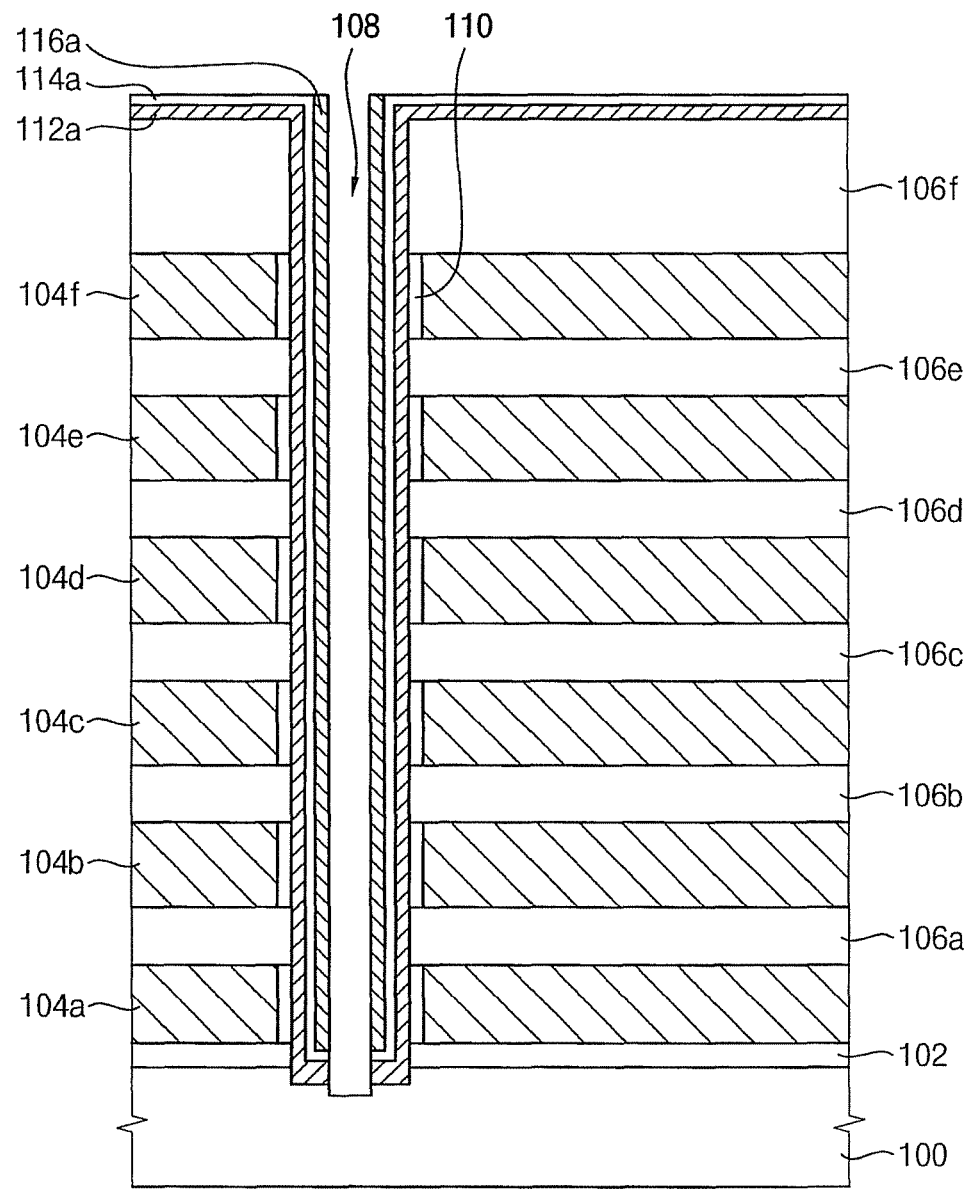

Referring to FIG. 2F, upper and bottom portions of the first semiconductor layer 116 may be partially removed by an etch-back process to form a first semiconductor layer pattern 116a on the sidewall of the first opening 108. The shape of the first semiconductor layer pattern 116a may be a hollow cylindrical shape. The first opening 108 may be of sufficiently large width even after forming the first semiconductor layer 116. An etch gas for partially removing the first semiconductor layer 116 may be diffused rapidly onto the bottom portion of the first semiconductor layer 116. Defects occurring when the first semiconductor layer 116 remains on a bottom surface of the first opening 108 may be reduced and the etch-back process may be performed more easily.

Portions of the tunnel insulation layer 114 and the charge trapping layer 112 on the bottom surface of the first opening 108 may be also removed to expose a top surface of the substrate 100. A preliminary charge trapping layer pattern 112a and a preliminary tunnel insulation layer pattern 114a may be formed.

Figure 2G:
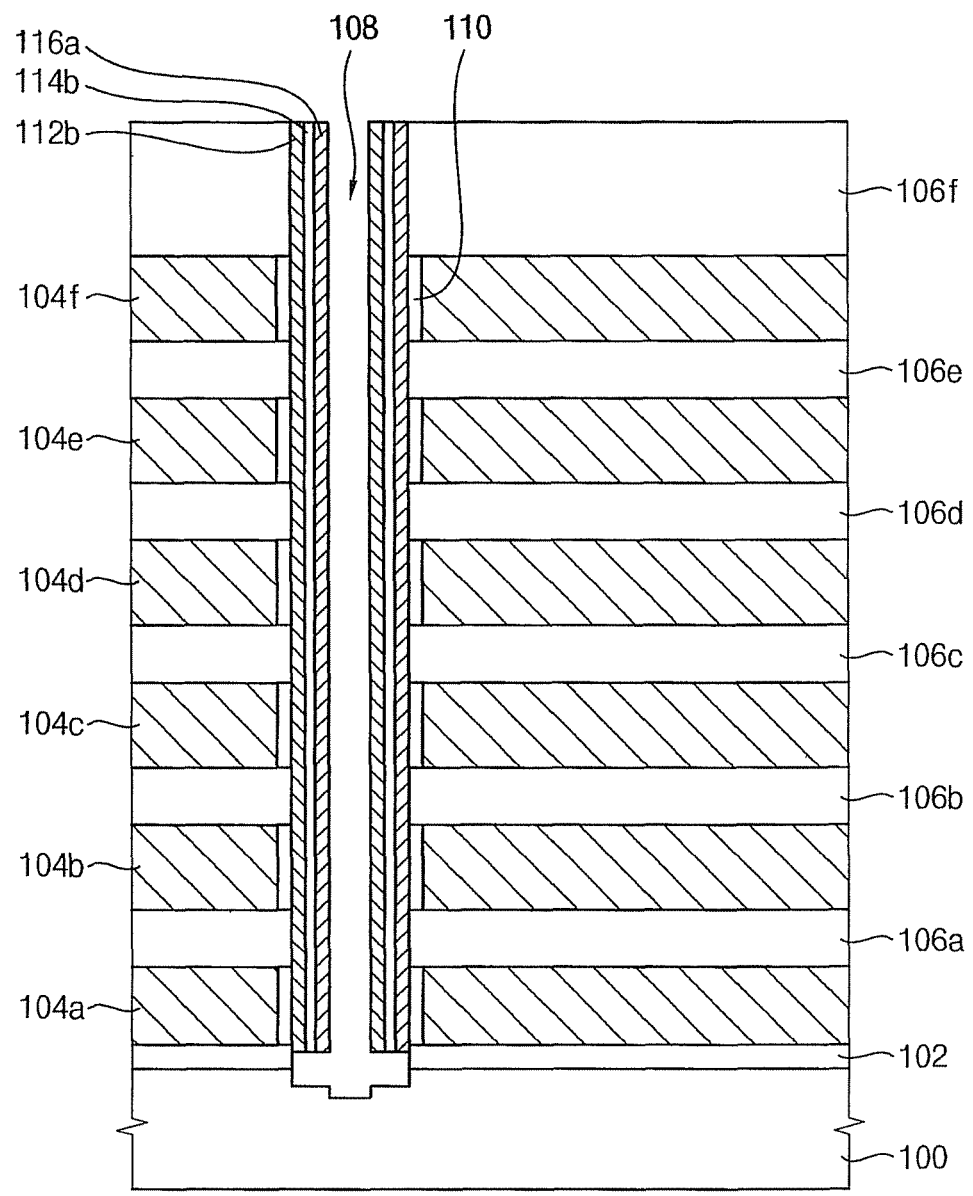

Referring to FIG. 2G bottom portions of the preliminary charge trapping layer pattern 112a and the preliminary tunnel insulation layer pattern 114a which are exposed by a lower portion of the first opening 108 may be partially removed by a wet etch process. Portions of the preliminary charge trapping layer pattern 112a and the preliminary tunnel insulation layer pattern 114a which are formed on the sidewall of the first opening 108 may not be removed by the wet etch process because the first semiconductor layer pattern 106a may be formed thereon.

The bottom portions of the preliminary charge trapping layer pattern 112a and the preliminary tunnel insulation layer pattern 114a which may not be covered by the first semiconductor layer pattern 106a may be removed to expose the top surface of the substrate 100. A charge trapping layer pattern 112b and a tunnel insulation layer pattern 114b may be formed sequentially on the sidewall of the first opening 108. The charge trapping layer pattern 112b and the tunnel insulation layer pattern 114b may not make contact with the top surface of the substrate 100 and may be spaced apart therefrom.

Figure 2H:
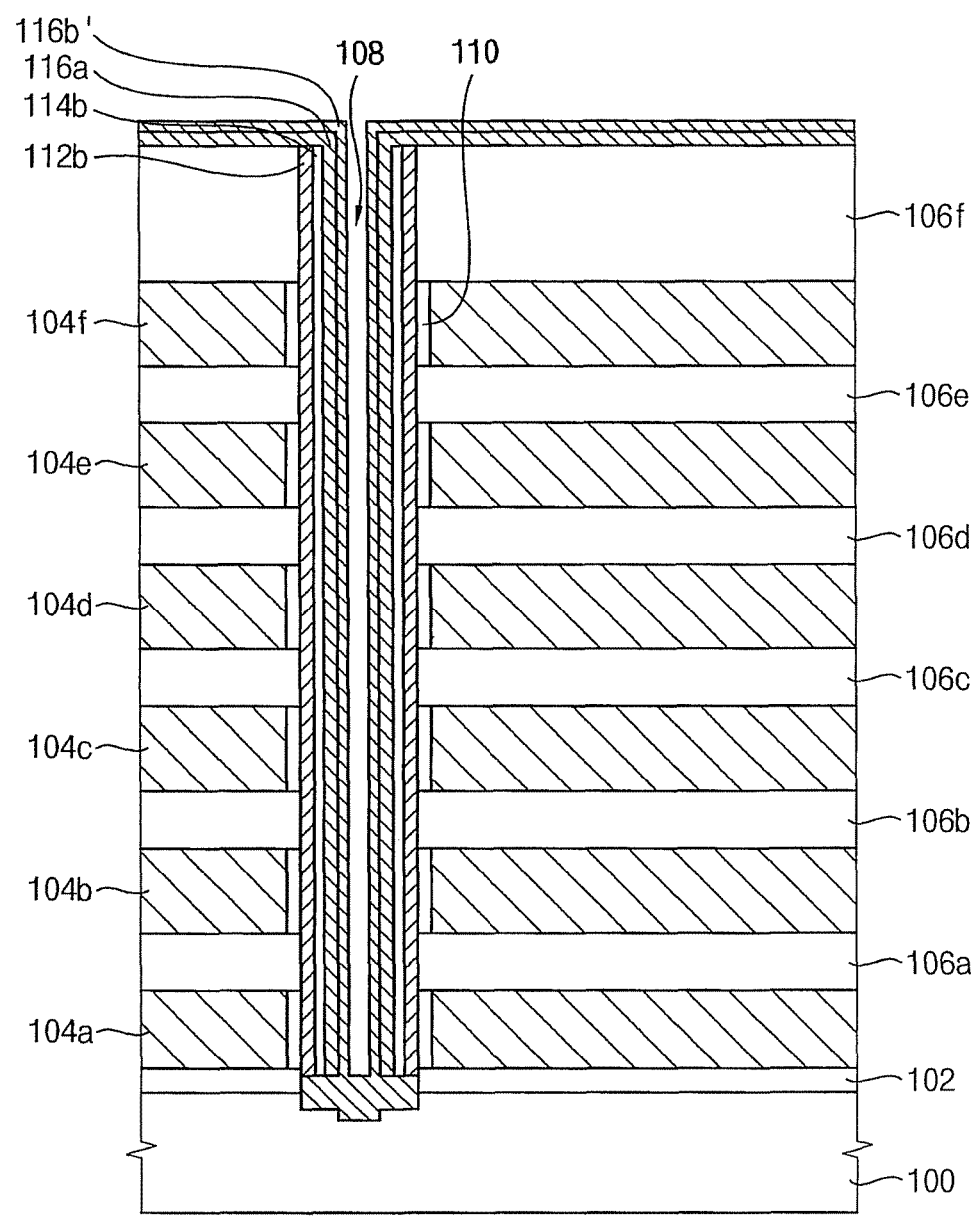
Figure 21:
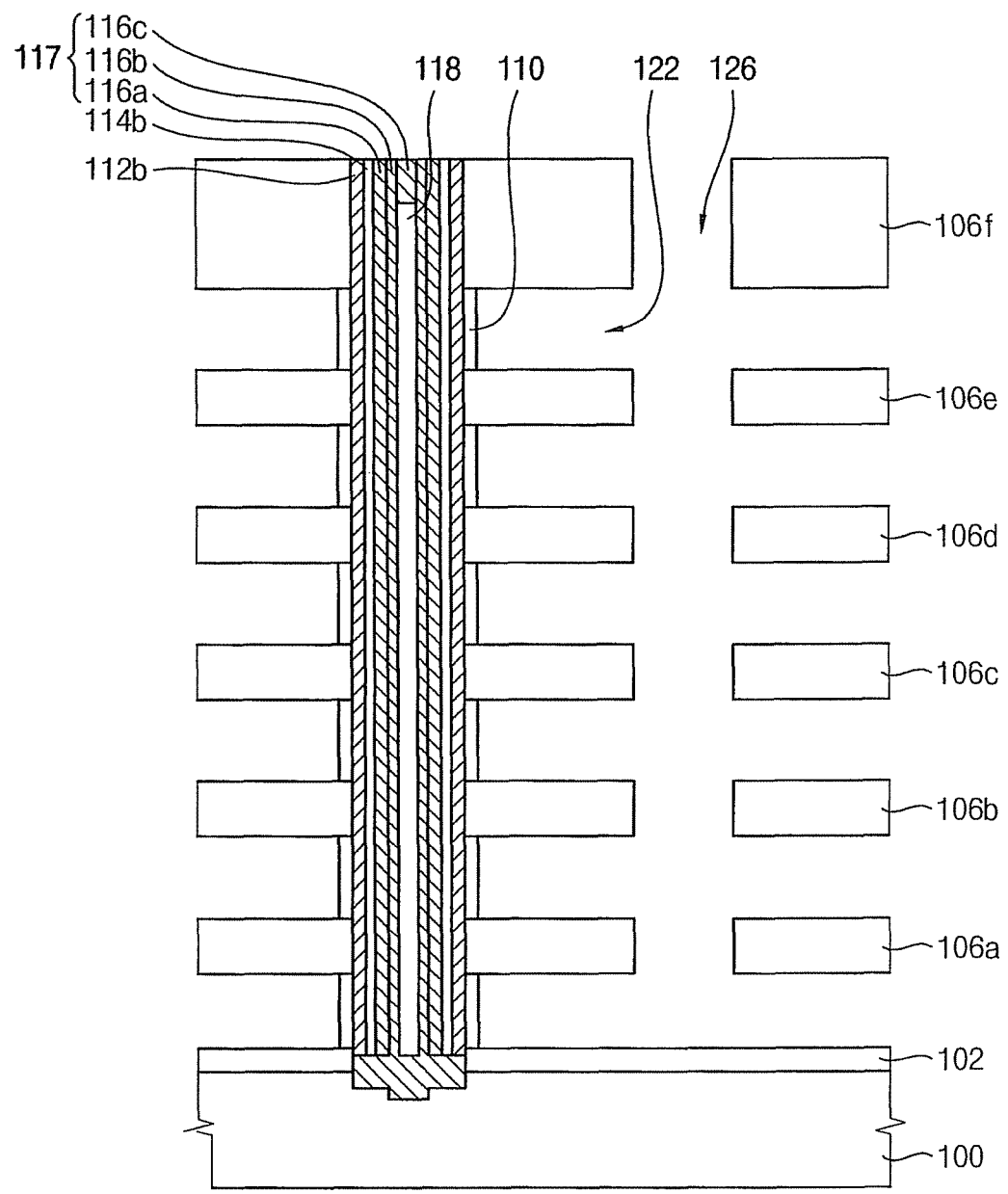

Referring to FIG. 2H, a second semiconductor layer 116b' (e.g., polysilicon) may be formed on the first semiconductor pattern 116a and a top surface of the mold structure 109. The second semiconductor layer 116b' may be also formed on the bottom surface of the first opening 108 to make contact with the substrate 100. When a voltage is applied to the substrate 100, data may be erased by a Fowler-Nordheim (FN) tunneling effect because the second semiconductor layer 116b' may be in contact the substrate 100. Data may be erased in a short and/or reduced time in a vertical semiconductor device without deteriorating the device during an operation for erasing data.

Referring to FIG. 2I, a filling layer (not shown) may be formed to sufficiently fill a remaining space of the first opening 108 after forming the second semiconductor layer 116b'. The filling layer may be formed to include a material with high etch selectivity to the sacrificial layers 104 (e.g., a silicon oxide). An upper portion of the filling layer may be partially removed by an etch-back process so that a top surface of the filling layer may be lower than that of the mold structure 109. A filling layer pattern 118 may be formed to partially fill the first opening 108.

A third semiconductor layer (e.g., polysilicon) may be formed on the filling layer pattern and the mold structure 109 to sufficiently fill the first opening 108. Upper portions of the second and third semiconductor layers may be planarized until the top surface of the mold structure is exposed to form second and third semiconductor layer patterns 116b and 116c, respectively. By performing the processes, a semiconductor pattern 117 including the first, second and third semiconductor layer patterns 116a, 116b and 116c may be formed in the first opening 108. The semiconductor pattern 117 may serve as a channel of a string.

The sacrificial layers 104 and the insulating interlayers 106 may be partially etched to form a second opening 126. For example, a mask pattern (not shown) may be formed on the uppermost insulating interlayer 106f. The sacrificial layers 104 and the insulating interlayers 106 may be partially removed using the mask pattern as an etch mask to form the second opening 126. According to at least one example embodiment, a plurality of second openings 126 may be formed in the first direction, and each second opening 126 may extend in the second direction between the first openings 108.

The sacrificial layers 104 exposed by the second opening 126 may be removed by a wet etch process. Only the insulating interlayers 106 may remain surrounding the semiconductor pattern 117, and the insulating interlayers 106 may be spaced apart from one another in a third direction (e.g., substantially perpendicular to a top surface of the substrate 100). A groove 122 may be defined by a space from which the sacrificial layers 104 are removed. According to example embodiments, a plurality of grooves 122 may be formed. The blocking layers 110 may be exposed by the grooves 122.

Figure 2J:
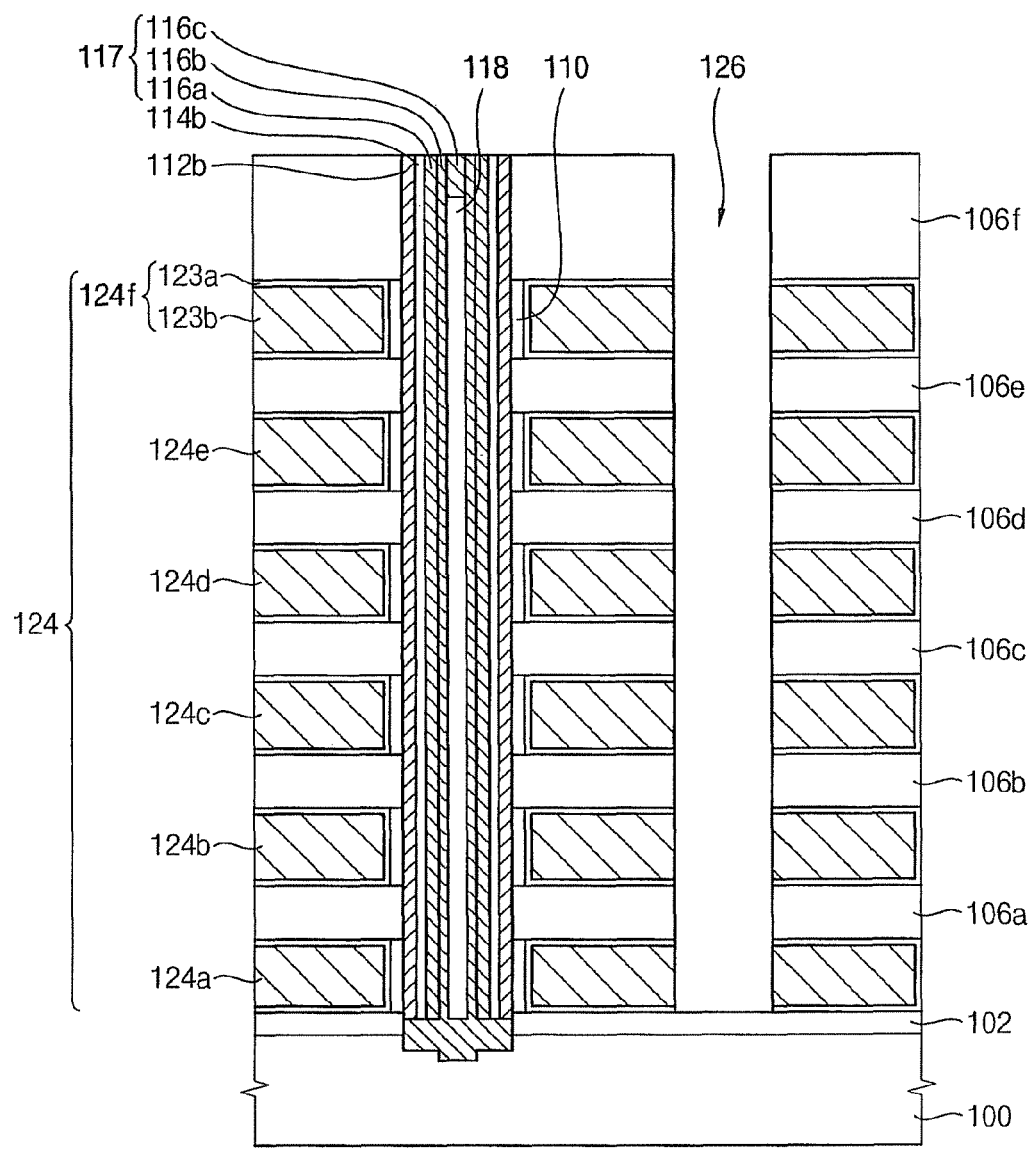

Referring to FIG. 2J, a conductive layer (not shown) may be formed to sufficiently fill the grooves 122. The conductive layer may partially fill the second opening 120, and thereby may be easily removed by a subsequent process. The conductive layer may be formed to include a conductive material with good step coverage to prevent or reduce voids from being generated in the conductive layer. The conductive material may be formed to include, for example, a metal and/or a metal nitride of low resistance (e.g., tungsten, tungsten nitride, titanium, titanium nitride, tantalum, tantalum nitride and/or platinum). According to at least one example embodiment, the conductive layer may be formed as a multi-layered structure. For example, the conductive layer may include a barrier metal layer and a metal layer sequentially stacked. The barrier metal layer may include, for example, titanium, titanium nitride, tantalum and/or tantalum nitride. The metal layer may include, for example, tungsten.

A portion of the conductive layer in the second opening 126 may be removed by a dry etch or wet etch process. The conductive layer may remain only in the grove 122 to form a control gate electrode 124. According to example embodiments, a plurality of control gate electrodes 124 may be formed in the grooves 122, respectively. Each control gate electrode 124 may include a barrier metal layer pattern 123a on the inner wall of the groove 122 and the blocking layer 110, and a metal layer pattern 123b on the barrier metal layer pattern 123a.

Referring to FIG. 2K, an insulation layer (not shown) may be formed on the mold structure 109 and the substrate 100 to fill the second opening 126. The insulation layer may be partially planarized to form an insulation layer pattern 128 in the second opening 126. An upper insulating interlayer 130 may be formed on top surfaces of the semiconductor pattern 117, the filling layer pattern 118, the insulation layer pattern 128 and the uppermost insulating interlayer 106f. A bit line contact 132 may be formed through the upper insulating interlayer 130 to contact the top surface of the semiconductor pattern 117. A bit line 134 may be formed on the upper insulating interlayer 130 to contact the bit line contact 134. The bit line 146 may be linearly shaped and may extend in the first direction. The bit line 146 may be electrically connected to the semiconductor pattern 117 via the bit line contact 132.

In accordance with example embodiments, a blocking layer 110 may be formed by partially oxidizing a sacrificial layer 104. The diameter or the width of the first opening 108 may not be reduced by the blocking layer 110 so that subsequent deposition and/or etch processes may be easily performed in the first opening 108. An initial diameter or width of the first opening 108 may be decreased to improve the integration density and reliability of a semiconductor device.

Figure 4A:
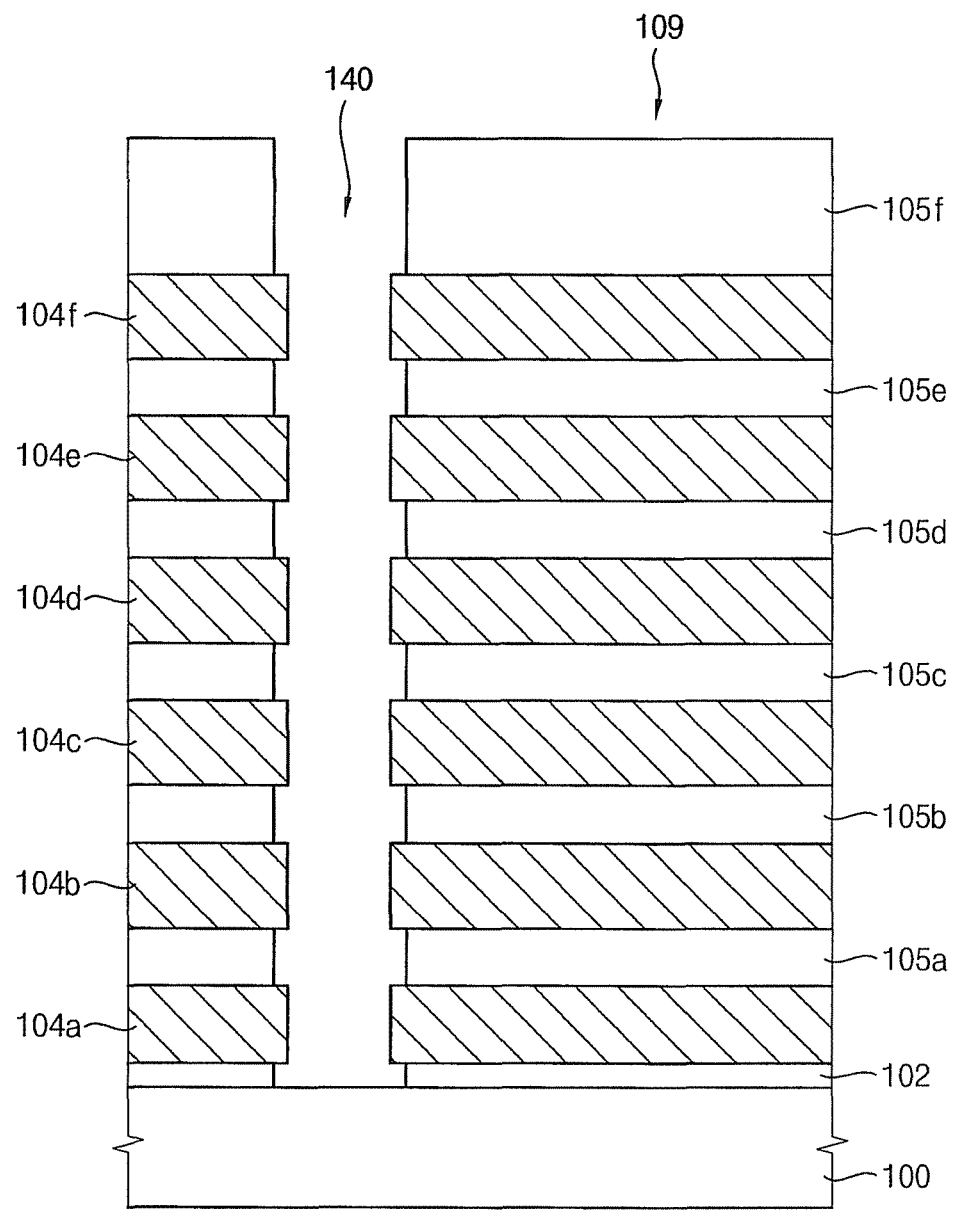

FIGS. 4A-4E are cross-sectional diagrams illustrating methods of manufacturing vertical semiconductor devices in accordance with other example embodiments. Referring to FIG. 4A, processes substantially the same as or similar to those illustrated in FIGS. 2A and 2B may be performed to form a preliminary mold structure with a first opening 140. The preliminary mold structure may include sacrificial layers 104 and insulating interlayers 105 which are repeatedly and alternately stacked on the pad insulation layer 102 as shown in FIG. 2B. Lateral portions of the insulating interlayers 105 exposed by the first opening 140 may be partially removed to form a mold structure 109. The sacrificial layers 104 may protrude from sidewalls of the insulating interlayers 105.

Figure 4B:
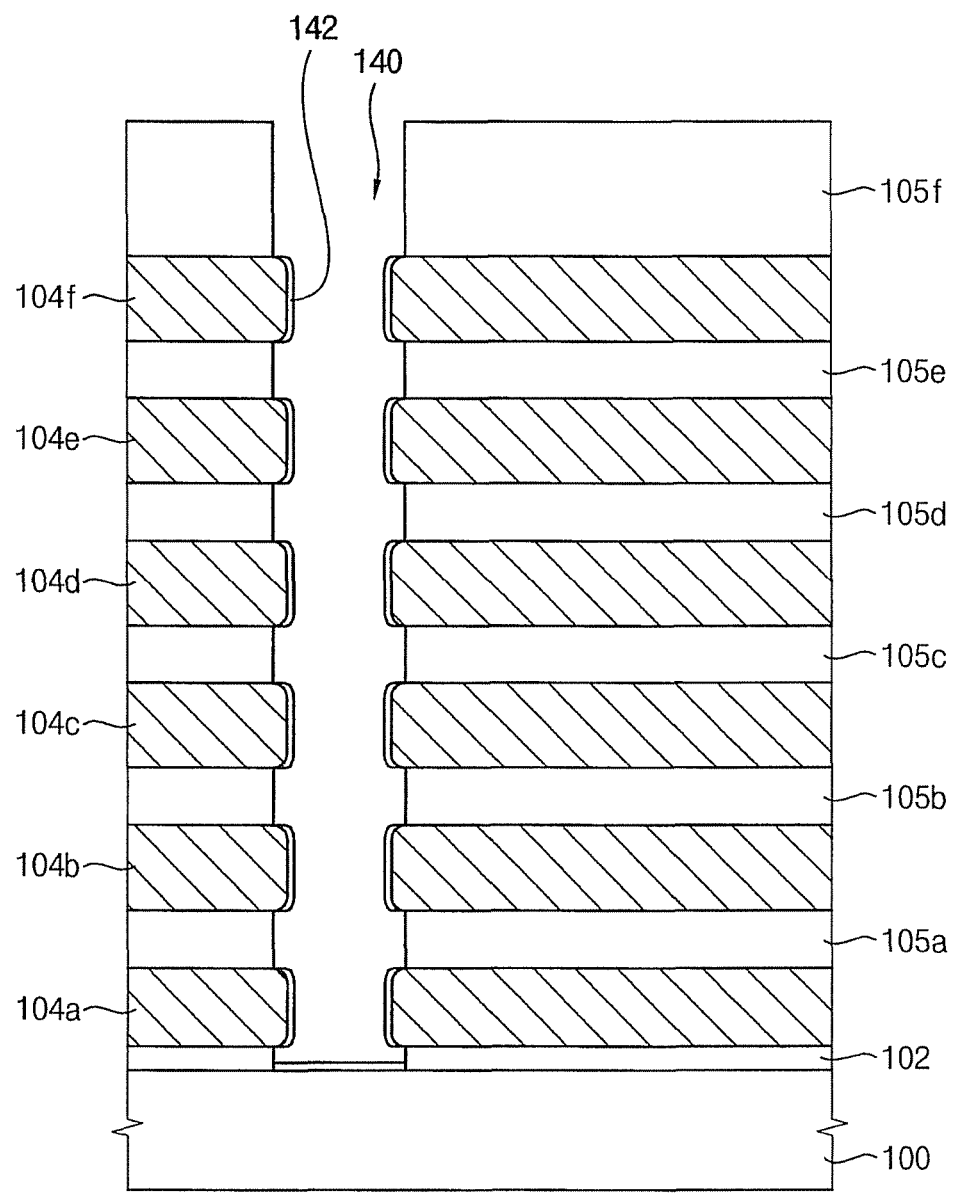
Figure 4C:
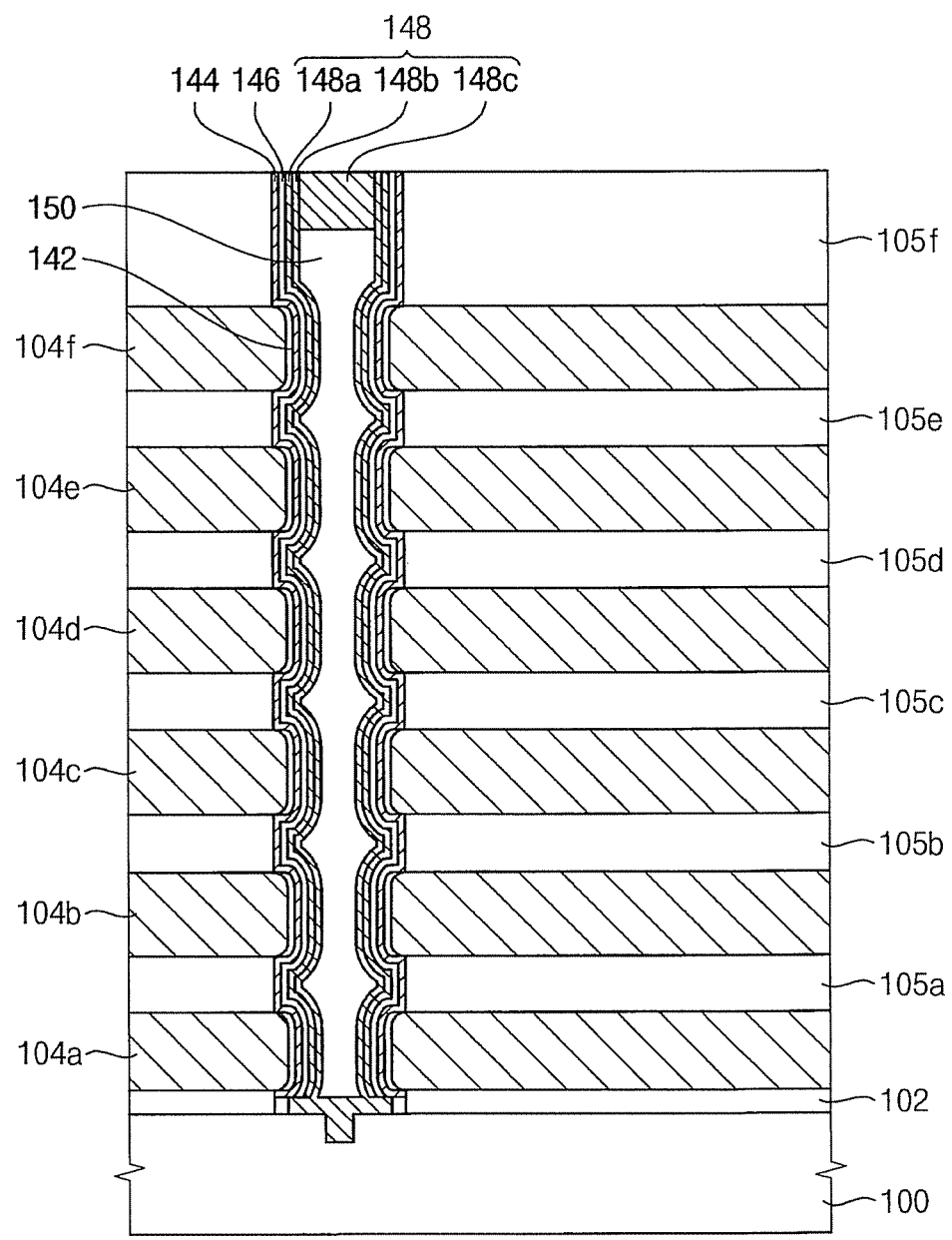

Referring to FIG. 4B, the protruded portions of the sacrificial layers 104 may be partially oxidized to form blocking layers 142. The protruded lateral portions of the sacrificial layers 104 including silicon nitride may be treated in an oxidizing atmosphere to form the blocking layers 142. For example, the blocking layers 142 may be formed by a radical oxidizing process. The lateral portions of the sacrificial layers 104 may protrude from the sidewalls of insulating interlayers 105 to be easily oxidized. Edge portions of the sacrificial layers 104 may also be oxidized into a curved shape so that a surface area of the blocking layers 142 may be a larger surface area.

The blocking layers 142 may be formed by the oxidizing process and not by an additional deposition process. A diameter or a width of the first opening 140 may not be decreased after forming the blocking layers 142.

A charge trapping layer pattern 144 and a tunnel insulation layer pattern 146 may be formed on the sidewalls of the insulating interlayers 105 and on the blocking layers 142. A first semiconductor layer pattern 148a (e.g., polysilicon) may be formed on the tunnel insulation layer pattern 146 and a second semiconductor layer pattern 148b (e.g., polysilicon) may be formed on the first semiconductor layer pattern 148a. A top surface of the substrate 100 may be exposed by the first opening 140. A filling layer pattern 150 may be formed on the second semiconductor layer pattern 148b to partially fill the first opening 140.

A third semiconductor layer pattern 148c (e.g., polysilicon) may be formed on the filling layer pattern 150 to fill a remaining portion of the first opening 140. A semiconductor pattern 148 including the first, second and third semiconductor layer patterns 148a, 148b and 148c may be formed in the first opening 140. The charge trapping layer pattern 144, the tunnel insulation layer pattern 146, the filling layer pattern 150 and the semiconductor pattern 148 may be formed by processes substantially the same as or similar to those illustrated with reference to FIGS. 2D-2I.

Referring to FIG. 4D, the sacrificial layers 104 and the insulating interlayers 105 may be partially etched to form a second opening 152. According to example embodiments, a plurality of second openings 152 may be formed in a first direction, and each second opening 152 may extend in a second direction substantially perpendicular to the first direction. The sacrificial layers 104 exposed by the second opening 152 may be removed by a wet etch process to form grooves 156. The control gate electrodes 158 may be formed to fill the grooves 156.

According to at least one example embodiment, each control gate electrode 158 may include a barrier metal layer pattern on an inner wall of the groove 156 and the blocking layer 142, and a metal layer pattern on the barrier metal layer pattern. The control gate electrodes 158 may include a curved surface to reduce an electric field concentration thereto. The second opening 152 and the control gate electrodes 158 may be formed by processes substantially the same as or similar to those illustrated with reference to FIGS. 2I and 2J.

Figure 4E:
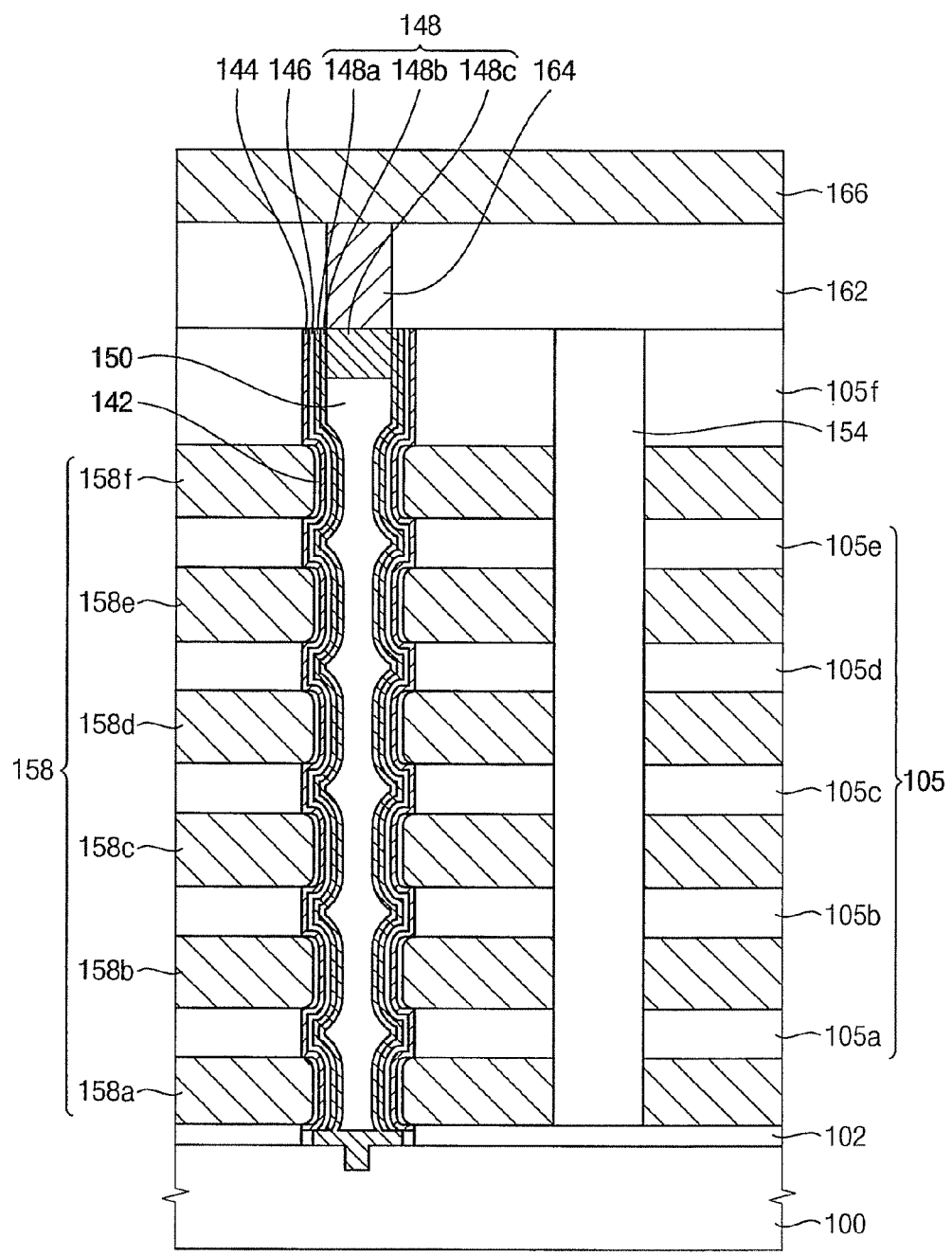

Referring to FIG. 4E, an insulation layer (not shown) may be formed to fill the second opening 152, and may be partially planarized to form an insulation layer pattern 154 in the second opening 152. By performing processes substantially the same as or similar to those illustrated in FIG. 2K, an upper insulating interlayer 162 may be formed on top surfaces of the semiconductor pattern 148, the filling layer pattern 150, the insulation layer pattern 154 and the uppermost insulating interlayer 105f. A bit line contact 164 may be formed through the upper insulating interlayer 162 to contact the top surface of the semiconductor pattern 148. A bit line 166 may be formed on the upper insulating interlayer 162 to contact the bit line contact 164.

Figure 5B:
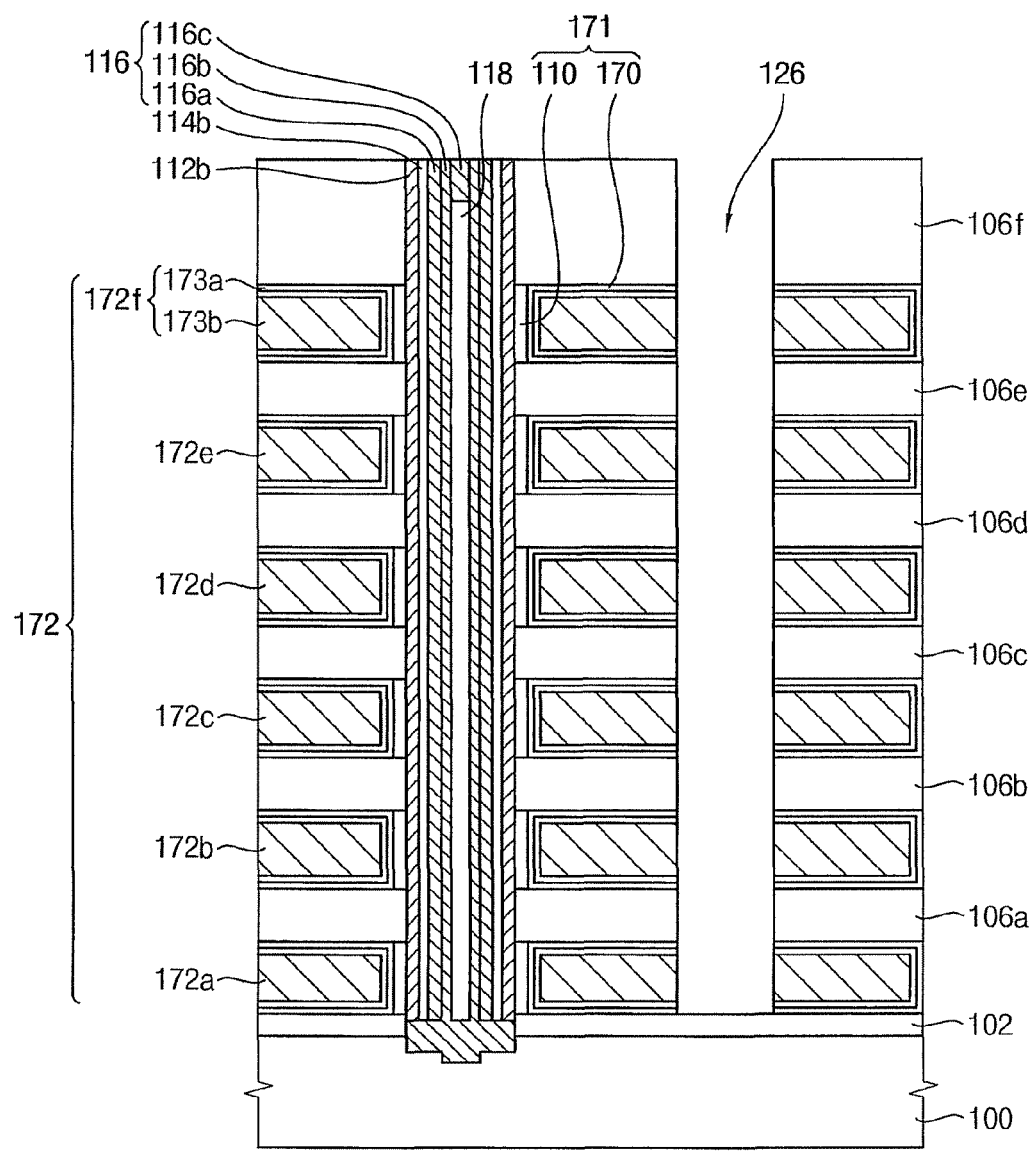
Figure 5C:
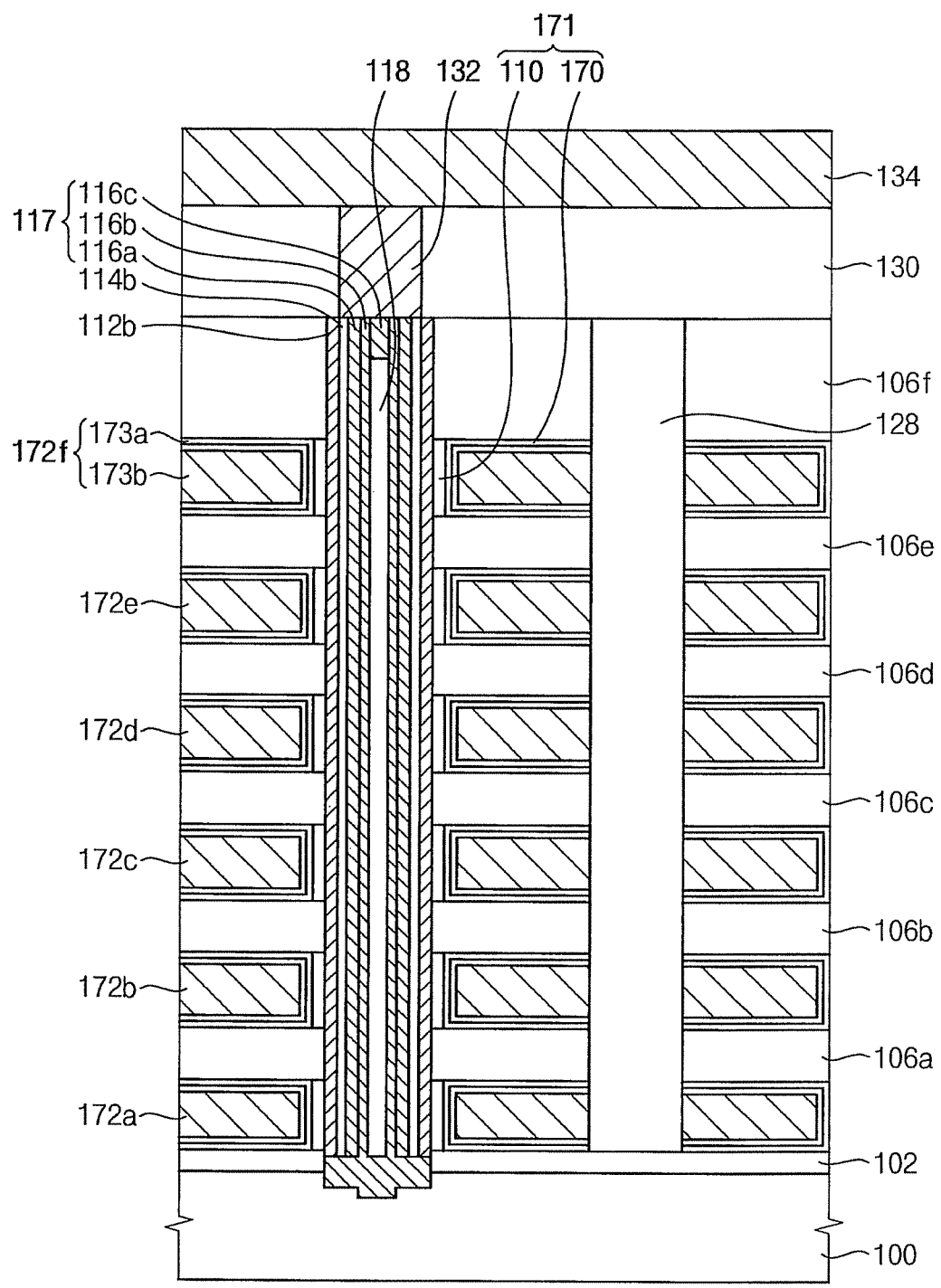

FIGS. 5A-5C are cross-sectional diagrams illustrating methods of manufacturing vertical semiconductor devices in accordance with other example embodiments. A vertical semiconductor device may be of a structure substantially the same as or similar to that illustrated in FIG. 2K except that an upper blocking layer may be further aimed on the blocking layer. Referring to FIG. 5A, the structure illustrated in FIG. 2I may be formed by processes substantially the same as or similar to those illustrated with reference to FIGS. 2A-2I. An upper blocking layer 170 may be formed on the blocking layer 110 and the insulating interlayers 106.

The upper blocking layer 170 may be formed to include, for example, a high dielectric constant metal oxide. For example, the upper blocking layer 170 may be formed to include an aluminum oxide. A blocking layer structure 171 including the blocking layer 110 and the upper blocking layer 170 may be formed on the inner wall of the grooves 122. By further forming the upper blocking layer 170 using a high-K metal oxide, operation characteristics of the vertical semiconductor device may be improved.

Referring to FIG. 5B, a conductive layer (not shown) may be formed to sufficiently fill the grooves 122. According to at least one example embodiment, a barrier metal layer (not shown) including, for example, titanium, titanium nitride, tantalum and/or tantalum nitride, may be formed. A metal layer (not shown) including, for example, tungsten may be formed on the barrier metal layer. A portion of the conductive layer formed in the second opening 126 may be removed using a dry etch process and/or a wet etch process.

The conductive layer may remain only in the groves 122 to form control gate electrodes 172. The control gate electrodes 172 may include a barrier metal layer pattern 173a on the inner wall of the groove 122 and a metal layer pattern 173b on the barrier metal layer pattern 173a. Processes substantially the same as or similar to those illustrated in FIG. 2K may be performed to manufacture a vertical semiconductor device illustrated in FIG. 5C.

Figure 6:
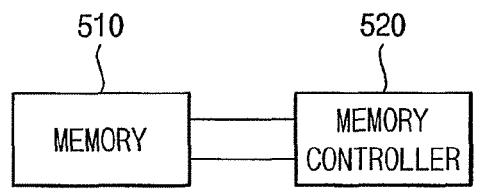

FIG. 6 is a block diagram illustrating memory cards including vertical semiconductor devices in accordance with example embodiments. Referring to FIG. 6, a memory card may include a memory 510 connected to a memory controller 520. The memory 510 may include a vertical semiconductor device according to example embodiments described with respect to FIGS. 1-5C. The memory controller 520 may supply input signals for controlling the operation of the memory 510.

Figure 7:
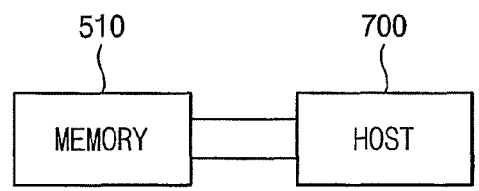

FIG. 7 is a block diagram illustrating systems including vertical semiconductor devices in accordance with example embodiments. A system may include a memory 510 connected to a host 700. The memory 510 may include a vertical semiconductor device according to example embodiments described with respect to FIGS. 1-5C. The host 700 may include electronic devices, for example, a personal computer, a camera, a mobile device, a game machine and/or a telecommunication device. The host may supply input signals for controlling or operating the memory 510, and the memory 510 may be used as a data storage medium.

Figure 8:
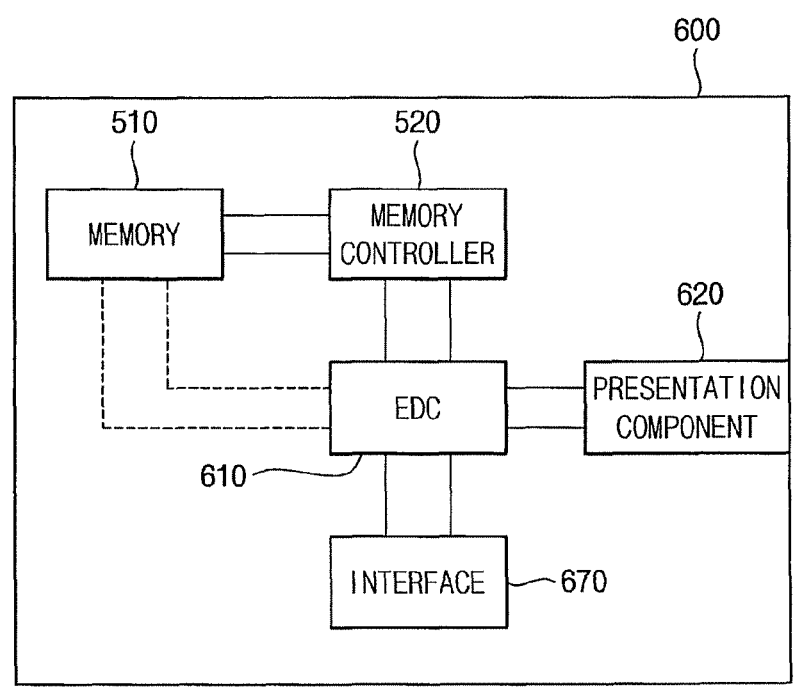

FIG. 8 is a block diagram illustrating portable devices including vertical semiconductor devices in accordance with example embodiments. A portable device 600 may be, for example, an MP3 player, video player, and/or a combination video and audio player. The portable device 600 may include a memory 510 and a memory controller 520. The memory 510 may include the vertical semiconductor device, according to example embodiments described with respect to FIGS. 1-5C. The portable device 600 may also include an encoder/decoder EDC 610, a presentation component 620 and an interface 670. Data (e.g., video and/or audio) may be input to and output from the memory 510 via the memory controller 520 by the EDC 610.

While example embodiments have been particularly shown and described, it will be understood by one of ordinary skill in the art that variations in form and detail may be made therein without departing from the spirit and scope of the claims.

What is claimed is:

1. A method of manufacturing a vertical semiconductor device, comprising:
   forming a mold structure including a plurality of sacrificial layers and a plurality of insulating interlayers by alternately stacking one of the sacrificial layers and one of the insulating interlayers on a substrate a plurality of times;
   forming a first opening through the mold structure to expose the substrate;
   forming a plurality of first blocking layers by oxidizing portions of the sacrificial layers exposed by the first opening;
   sequentially forming a charge trapping layer, a tunnel insulation layer and a first semiconductor layer on the substrate and a sidewall of the mold structure in the first opening;
   partially etching portions of the first semiconductor layer, the charge trapping layer and the tunnel insulation layer on the substrate in the first opening to form a first semiconductor layer pattern, a charge trapping layer pattern and a tunnel insulation layer pattern on the sidewall of the mold structure;
   forming a second semiconductor layer on the first semiconductor layer pattern and the substrate to form a second semiconductor layer pattern including the first semiconductor layer pattern and the second semiconductor layer;
   partially removing the sacrificial layers and the insulating interlayers to form a second opening;
   removing the sacrificial layers to form grooves between the insulating interlayers; and
   forming a plurality of control gate electrodes in the grooves.

2. The method of claim 1, wherein the sacrificial layers include a silicon nitride.

3. The method of claim 2, wherein the first blocking layers include a silicon oxide.

4. The method of claim 1, wherein the forming a plurality of first blocking layers includes forming the first blocking layers using a radical oxidation process.

5. The method of claim 1, wherein a difference between a first width of the first opening prior to the forming the first blocking layers and a second width of the first opening after the forming the first blocking layers is less than a thickness of each blocking layer.

6. The method of claim 1, wherein the partially etching portions of the first semiconductor layer, the charge trapping layer and the tunnel insulation layer includes:
   etching a portion of the first semiconductor layer on the substrate in the first opening to form the first semiconductor layer pattern on the sidewall; and
   etching portions of the charge trapping layer and the tunnel insulation layer on the substrate in the first opening to expose the substrate.

7. The method of claim 1, further comprising:
   forming a second blocking layer between each first blocking layer and a corresponding one of the control gate electrodes, the second blocking layer including a metal oxide.

8. The method of claim 1, wherein the forming a plurality of control gate electrodes includes:

forming a conductive layer to at least partially fill the grooves and the second opening; and removing a part of the conductive layer in the second opening so that the conductive layer remains only in the grooves.

9. The method of claim 8, wherein the forming a plurality of control gate electrodes includes forming the conductive layer by sequentially depositing a barrier metal layer and a metal layer.

10. The method of claim 9, wherein:

the barrier metal layer includes one of titanium and a titanium nitride; and the metal layer includes tungsten.

11. The method of claim 7, wherein the second blocking layer includes an aluminum oxide.

12. The method of claim 11, wherein the forming a second blocking layer includes forming the second blocking layer conformally to the first blocking layers and surfaces of the insulating interlayers inside the grooves.

13. The method of claim 1, wherein the forming a second semiconductor layer includes forming the second semiconductor layer on the sidewall of the mold structure and on the substrate in the first opening such that the first opening is not completely filled.

14. The method of claim 13, further comprising:

forming a filling layer on the second semiconductor layer pattern to fill the first opening.

15. The method of claim 6, wherein the partially etching portions of the first semiconductor layer, the charge trapping layer and the tunnel insulation layer includes etching the charge trapping layer and the tunnel insulation layer using a wet etch process.

16. A method of manufacturing a vertical semiconductor device, comprising:

forming a first insulating layer;

forming a first sacrificial layer including a first material on the first insulating layer;

forming a second insulating layer on the first sacrificial layer;

forming a second sacrificial layer including a second material on the second insulating layer;

removing part of the first insulating layer, the first sacrificial layer, the second insulating layer and the second sacrificial layer to form a sidewall;

oxidizing portions of the first and second materials exposed along the sidewall; and removing unoxidized portions of the first and second materials.

17. The method of claim 16, further comprising:

forming a charge trapping layer on the oxidized portions of the first and second materials;

forming a tunnel insulation layer on the charge trapping layer;

forming a channel extending along an entire length of the sidewall on the tunnel insulation layer;

forming a first control gate on a side of the oxidized portion of the first material opposite the charge trapping layer; and forming a second control gate on a side of the oxidized portion of the second material opposite the charge trapping layer.

18. The method of claim 16, wherein the oxidizing portions of the first and second materials includes radical oxidation of the first and second materials.

19. The method of claim 18, wherein at least one of the first and second materials is a silicon nitride.

20. A method of manufacturing a portable device including a memory and a memory controller, comprising:

the method of manufacturing a vertical semiconductor device of claim 1.

* * * * *